US010278498B2

(12) United States Patent
Chen et al.

(10) Patent No.: US 10,278,498 B2
(45) Date of Patent: May 7, 2019

(54) BRACKET DEVICE AND SLIDE RAIL ASSEMBLY COMPRISING THE SAME

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 18 days.

(21) Appl. No.: 15/627,402

(22) Filed: Jun. 19, 2017

(65) Prior Publication Data

US 2018/0125234 A1     May 10, 2018

(30) Foreign Application Priority Data

Nov. 10, 2016 (TW) .............................. 105136760 A

(51) Int. Cl.
| | |
|---|---|
| *A47B 88/43* | (2017.01) |
| *A47B 88/483* | (2017.01) |
| *H05K 7/14* | (2006.01) |
| *A47B 88/423* | (2017.01) |
| *H05K 7/18* | (2006.01) |

(52) U.S. Cl.
CPC ............ *A47B 88/43* (2017.01); *A47B 88/483* (2017.01); *H05K 7/1489* (2013.01); *A47B 2088/4235* (2017.01); *H05K 7/1488* (2013.01); *H05K 7/183* (2013.01)

(58) Field of Classification Search
CPC .................. A47B 88/43; A47B 88/483; A47B 2088/4235; H05K 7/1489; H05K 7/1488; H05K 7/183
See application file for complete search history.

(56) References Cited

U.S. PATENT DOCUMENTS

| 6,773,080 B2 * | 8/2004 | Chen ...................... A47B 57/40 |
| | | 211/26 |
| 6,945,619 B1 * | 9/2005 | Chen .................... A47B 88/487 |
| | | 312/334.44 |
| 7,281,633 B2 * | 10/2007 | Hartman ................. G06F 1/183 |
| | | 211/192 |

(Continued)

FOREIGN PATENT DOCUMENTS

| CN | 103945671 | 1/2017 |
| JP | 3127644 U | 12/2006 |
| JP | 3187606 U | 12/2013 |

*Primary Examiner* — Eret C McNichols
(74) *Attorney, Agent, or Firm* — Winston Hsu

(57) ABSTRACT

A bracket device includes a supporting frame, a bracket, an elastic member and a fastening member. The bracket is movably connected to the supporting frame. The elastic member is mounted to the supporting frame. The fastening member is connected to the elastic member. When the bracket is located at a first position relative to the supporting frame, the fastening member is in a locking state. When the bracket is located at a second position relative to the supporting frame, the fastening member is in an unlocking state.

12 Claims, 24 Drawing Sheets

(56) References Cited

U.S. PATENT DOCUMENTS

| | | | | |
|---|---|---|---|---|
| 7,357,362 B2* | 4/2008 | Yang | H05K 7/1489 | 248/220.22 |
| 7,404,611 B1* | 7/2008 | Que | A47B 88/493 | 312/333 |
| 7,744,177 B2* | 6/2010 | Peng | A47B 88/43 | 312/223.1 |
| 7,930,812 B2* | 4/2011 | Curnalia | H05K 7/1489 | 211/183 |
| 8,146,756 B2* | 4/2012 | Brock | A47B 96/06 | 211/192 |
| 8,353,494 B2* | 1/2013 | Peng | A47B 88/43 | 211/192 |
| 9,237,808 B2* | 1/2016 | Chen | A47B 96/07 | |
| 9,370,120 B2* | 6/2016 | Chen | A47B 96/025 | |
| 9,480,183 B2* | 10/2016 | Chen | H05K 7/1489 | |
| 9,532,483 B1* | 12/2016 | Chang | F16B 2/12 | |
| 9,629,460 B1 | 4/2017 | Chen | | |
| 9,681,573 B2* | 6/2017 | Chen | H05K 7/1489 | |
| 9,854,911 B1* | 1/2018 | Chang | A47B 96/068 | |
| 10,051,759 B1* | 8/2018 | Chen | H05K 7/1489 | |
| 10,085,561 B2* | 10/2018 | Chen | A47B 96/07 | |
| 10,149,538 B2* | 12/2018 | Chen | H05K 7/1489 | |
| 2005/0156493 A1* | 7/2005 | Yang | H05K 7/1489 | 312/334.5 |
| 2005/0189855 A1* | 9/2005 | Naue | A47B 88/43 | 312/334.4 |
| 2005/0274680 A1* | 12/2005 | Allen | A47B 96/068 | 211/26 |
| 2008/0296455 A1* | 12/2008 | Brock | A47B 96/06 | 248/298.1 |
| 2009/0166485 A1 | 7/2009 | Chen | | |
| 2009/0261699 A1* | 10/2009 | Yu | A47B 88/43 | 312/334.46 |
| 2009/0283652 A1* | 11/2009 | Chen | H05K 7/1489 | 248/298.1 |
| 2009/0309471 A1* | 12/2009 | Yu | H05K 7/1489 | 312/334.44 |
| 2011/0192946 A1* | 8/2011 | Yu | H05K 7/1489 | 248/222.11 |
| 2011/0233355 A1 | 9/2011 | Peng | | |
| 2012/0076446 A1* | 3/2012 | Chen | A47B 88/43 | 384/21 |
| 2012/0145850 A1* | 6/2012 | Yu | H05K 7/1489 | 248/220.22 |
| 2012/0193489 A1* | 8/2012 | Yu | H05K 7/1489 | 248/201 |
| 2012/0292928 A1* | 11/2012 | Chang | H05K 7/1489 | 292/273 |
| 2013/0056432 A1* | 3/2013 | Lin | H05K 7/1489 | 211/123 |
| 2014/0070064 A1* | 3/2014 | Chen | A47B 88/43 | 248/221.11 |
| 2014/0217049 A1* | 8/2014 | Chen | H05K 7/1489 | 211/195 |
| 2014/0265788 A1* | 9/2014 | Judge | H05K 7/1489 | 312/334.1 |
| 2015/0069196 A1* | 3/2015 | Chen | A47B 47/0058 | 248/218.4 |
| 2015/0201754 A1* | 7/2015 | Chen | A47B 96/025 | 248/219.3 |
| 2015/0335156 A1 | 11/2015 | Chen | | |
| 2016/0097229 A1* | 4/2016 | Chen | A47B 88/40 | 16/94 R |
| 2017/0079427 A1* | 3/2017 | Chen | H05K 7/1489 | |
| 2018/0054909 A1* | 2/2018 | Chen | H05K 7/1489 | |
| 2018/0199713 A1* | 7/2018 | Chen | A47B 88/43 | |
| 2018/0360215 A1* | 12/2018 | Chen | H05K 7/1489 | |

* cited by examiner

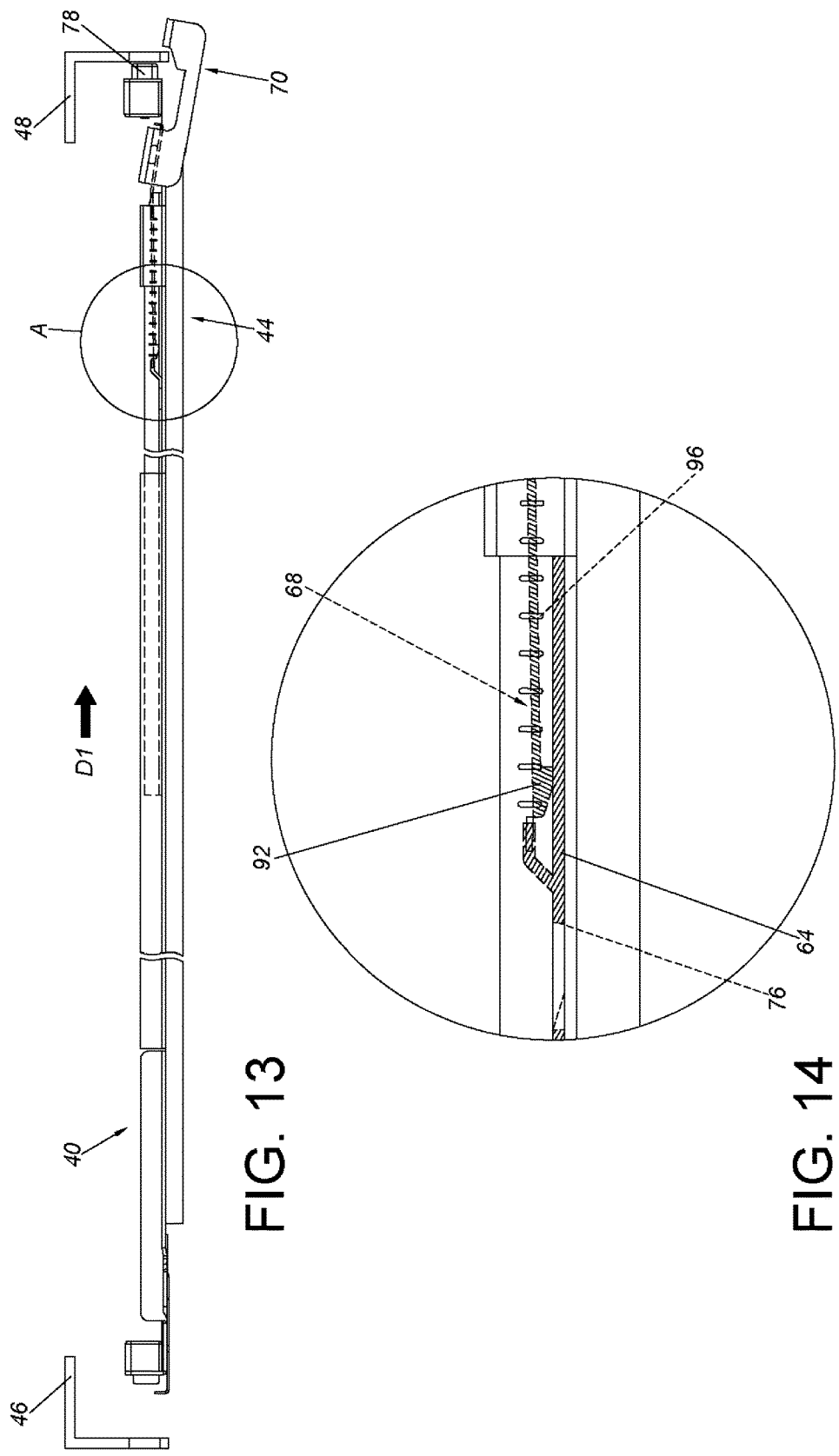

BRACKET DEVICE AND SLIDE RAIL ASSEMBLY COMPRISING THE SAME

BACKGROUND OF THE INVENTION

1. Field of the Invention

The present invention relates to a bracket device for slide rail, and more particularly, to a bracket device capable of mounting a slide rail to a post of a rack.

2. Description of the Prior Art

China utility model patent publication number CN 205548022U provides a back locking structure to be unlocked at a front end of a slide rail, which includes a slide rail with two ends respectively arranged with a front locking mechanism and a back locking mechanism. The back locking mechanism comprises a split type mainboard installed with a post locking plate. The mainboard is divided into a first motherboard and a second motherboard. The first motherboard comprises a first motherboard body with a Z-shaped cross section. A plurality of first mounting holes is formed on a middle part of the first motherboard body, and a forked tail lug is form on a front end of the middle part of the first motherboard body. The second mainboard comprises a second mainboard body having a head part formed with a bending structure to connect to the first motherboard. A forked tail groove is formed on a middle part of a front end surface of the bending structure. A second mounting hole is formed on a lateral part of the bending structure of the second mainboard body. The second mainboard is fixed to the slide rail by a fastener. An unlocking rod is arranged inside a sliding frame of the slide rail. An elastic piece is arranged on a head part. One end of the elastic piece is fixed to the sliding frame through a retaining member, and the other end of the elastic piece is fixed to the post locking plate through the retaining member.

According to the arrangement disclosed by the prior art, the post locking plate cannot be held in an unlocking state. In order to hold the post locking plate in the unlocking state to facilitate installation of the slide rail to the post of the rack, it must rely on a user to continuously apply an external force. However, when multiple server devices are stacked on the rack, there is no extra space for the user to continuously apply the external force in order to keep the back locking mechanism open (in the unlocking state), for allowing the user in front of the rack to mount the slide rail to front and rear posts of the rack.

SUMMARY OF THE INVENTION

The present invention relates to a bracket device capable of mounting a slide rail assembly to a rack through one-man operation.

According to an embodiment of the present invention, a slide rail assembly comprises a rail member having a first end part and a second end part opposite to the first end part; a supporting rail fixedly connected to the rail member; a first bracket connected to the rail member and adjacent to the first end part of the rail member; and a bracket device located adjacent to the second end part of the rail member. The bracket device comprises a supporting frame movably mounted to the supporting rail; a second bracket movably connected to the supporting frame; a fastening member arranged at one side of the second bracket; and an elastic member having a first portion movably mounted to the supporting frame, and a second portion bent relative to the first portion and connected to the fastening member for providing an elastic force to drive the fastening member to deflect relative to the second bracket.

Preferably, the supporting rail is arranged with a first blocking part. The supporting frame is arranged with a second blocking part configured to abut against the first blocking part to allow the supporting rail to drive the supporting frame to move.

Preferably, the supporting frame comprises a first engaging feature. The elastic member comprises a first elastic part, a second elastic part and a connecting part connected between the first elastic part and the second elastic part. The first elastic part is bent relative to the connecting part to accumulate the elastic force. An end of the second elastic part is arranged with at least one second engaging feature. The second engaging feature is configured to be engaged with the first engaging feature of the supporting frame.

Preferably, the slide rail assembly further comprises an auxiliary elastic member connected between the supporting frame and the elastic member.

Preferably, the supporting frame comprises a limiting feature. The limiting feature is a bounded elongated hole having a first boundary end and a second boundary end. A connecting member is configured to connect the elastic member to the supporting frame to allow the elastic member to move within a limited range defined by the first and second boundary ends of the limiting feature and the connecting part.

Preferably, the supporting frame is arranged with an unlocking part adjacent to the first engaging feature. The unlocking part has an inclined surface or an arc surface.

Preferably, the slide rail assembly further comprises an operating member movably mounted to the supporting frame. The operating member comprises an unlocking part corresponding to the second engaging feature of the elastic member. When the operating member is operatively moved, the second engaging feature of the elastic member is disengaged from the first engaging feature of the supporting frame by the unlocking part of the operating member.

Preferably, the slide rail assembly further comprises an auxiliary elastic member mounted to the supporting frame. The auxiliary elastic member comprises a supporting leg and an elastic leg. The elastic leg has a bending part. The second bracket is arranged with a stopping part. The fastening member comprises an auxiliary feature. When the fastening member of the bracket device is in a locking state, the bending part of the elastic leg of the auxiliary elastic member is configured to abut against the stopping part of the second bracket to hold the fastening member in the locking state. The fastening member is adjacent to or configured to abut against a top face of the supporting leg of the auxiliary elastic member in the locking state. When the supporting frame is applied by a force to move, the auxiliary elastic member is driven to move by the supporting frame, so as to allow the bending part of the elastic leg of the auxiliary elastic member to be disengaged from the stopping part, and allow the top face of the supporting leg of the auxiliary elastic member to face the auxiliary feature of the fastening member, such that the fastening member is driven to switch from the locking state to an unlocking state by the elastic force of the elastic member and be held in the unlocking state.

Preferably, an end part of the supporting frame is arranged with a first stopping feature. An end part of the elastic member is arranged with a second stopping feature. When the fastening member is in a locking state, the first stopping feature is configured to abut against the second stopping feature to hold the fastening member in the locking state.

According to another embodiment of the present invention, a bracket device comprises a supporting frame; a bracket movably connected to the supporting frame; an elastic member mounted to the supporting frame, the elastic member comprising a first elastic part and a connecting part connected to the first elastic part, the first elastic part bent relative to the connecting part to accumulate an elastic force; and a fastening member connected to the first elastic part of the elastic member. Wherein, when the second bracket is located at a first position relative to the supporting frame, the fastening member is in a locking state. Wherein, when the second bracket is moved from the first position to a second position relative to the supporting frame, the fastening member is driven to switch from the locking state to an unlocking state by the elastic force of the elastic member.

According to another embodiment of the present invention, a slide rail assembly is configured to be mounted to a first post and a second post of a rack. The slide rail assembly comprises a rail member having a first end part and a second end part opposite to first end part; a first bracket connected to the rail member and adjacent to the first end part of the rail member, the first bracket being configured to be mounted to the first post; and a bracket device adjacent to the second end part of the rail member, wherein the bracket device comprises a supporting frame; a second bracket movably connected to the supporting frame; an elastic member mounted to the supporting frame; and a fastening member connected to the elastic member. Wherein, when the second bracket is located at a second position relative to the supporting frame, the fastening member is in an unlocking state to allow the second bracket to be mounted to the second post; when the second bracket is moved from the second position to a first position relative to the supporting frame, the fastening member is driven to switch from the unlocking state to a locking state by an elastic force of the elastic member, in order to lock the second bracket to the second post.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 13 is a diagram showing the bracket device being mounted to the second post of the rack according to the first embodiment of the present invention.

FIG. 14 is an enlarged view of an area A of FIG. 13.

DETAILED DESCRIPTION

Figure 1:
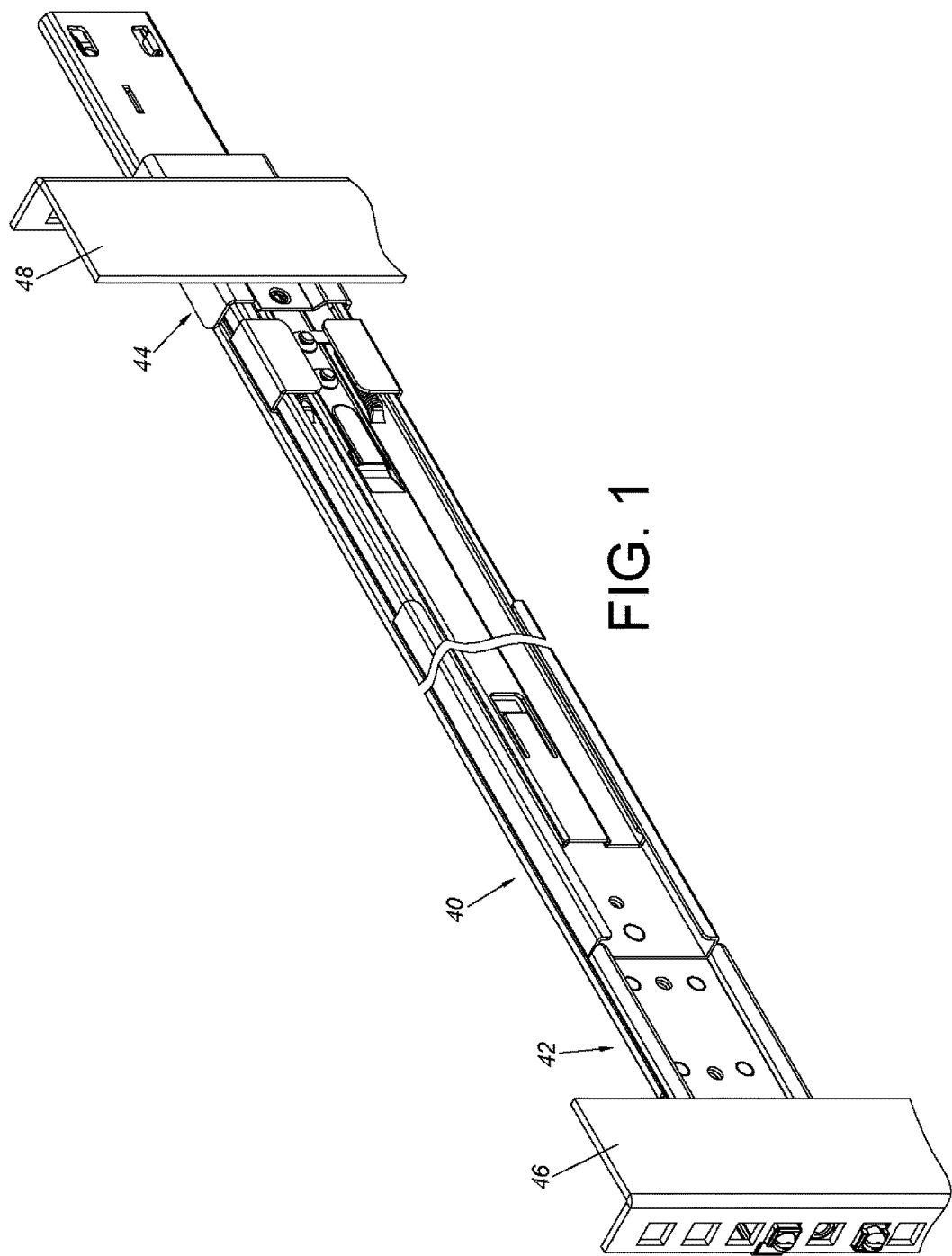
FIG. 1 is a diagram showing a slide rail assembly being mounted to a first post and a second post of a rack according to a first embodiment of the present invention.

FIG. 1 shows that a slide rail assembly 40 is mounted to a first post 46 and a second post 48 of a rack through a first bracket 42 and a bracket device 44 according to a first embodiment of the present invention.

Figure 2:
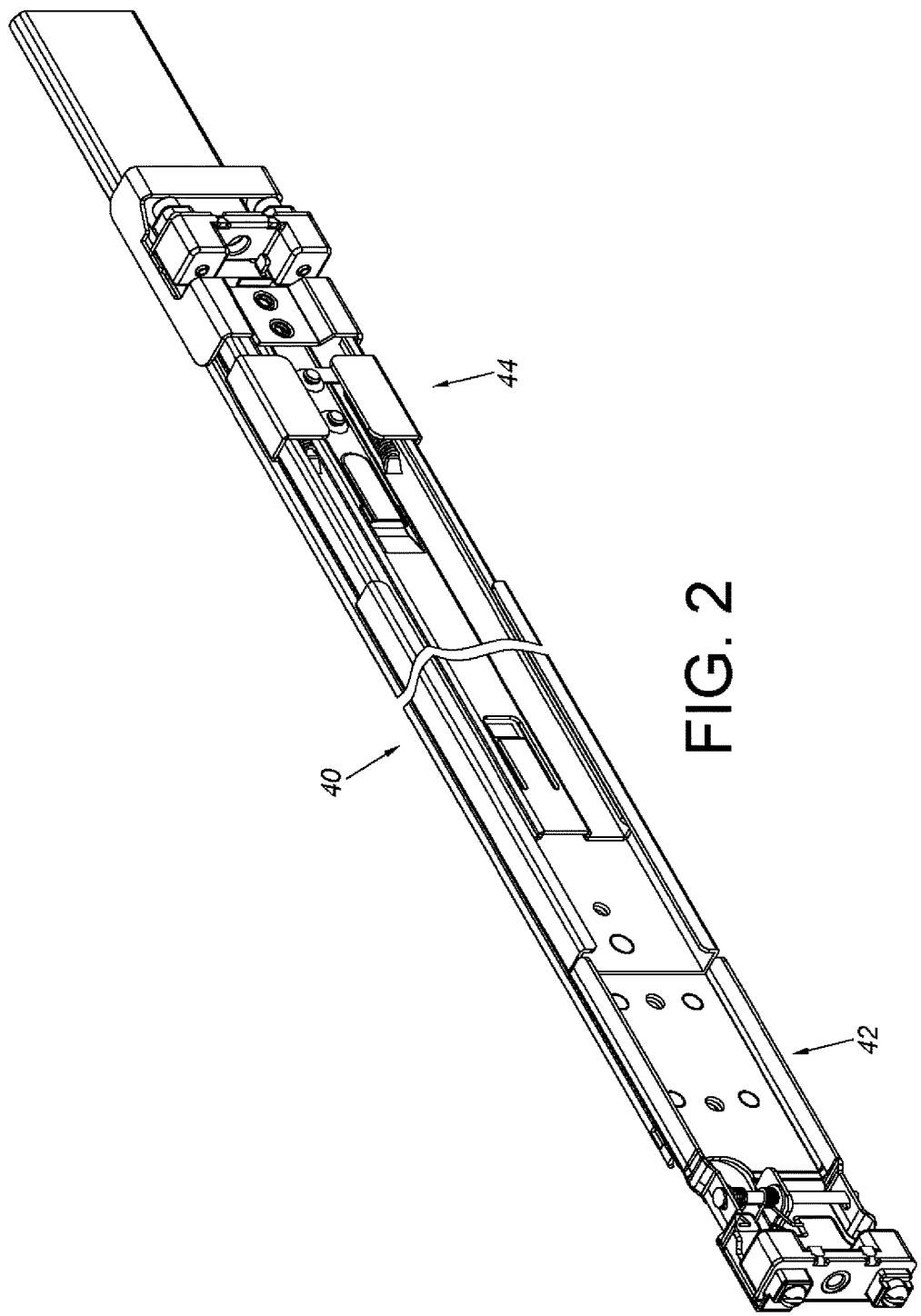
FIG. 2 is a diagram showing the slide rail assembly according to the first embodiment of the present invention.
Figure 3:
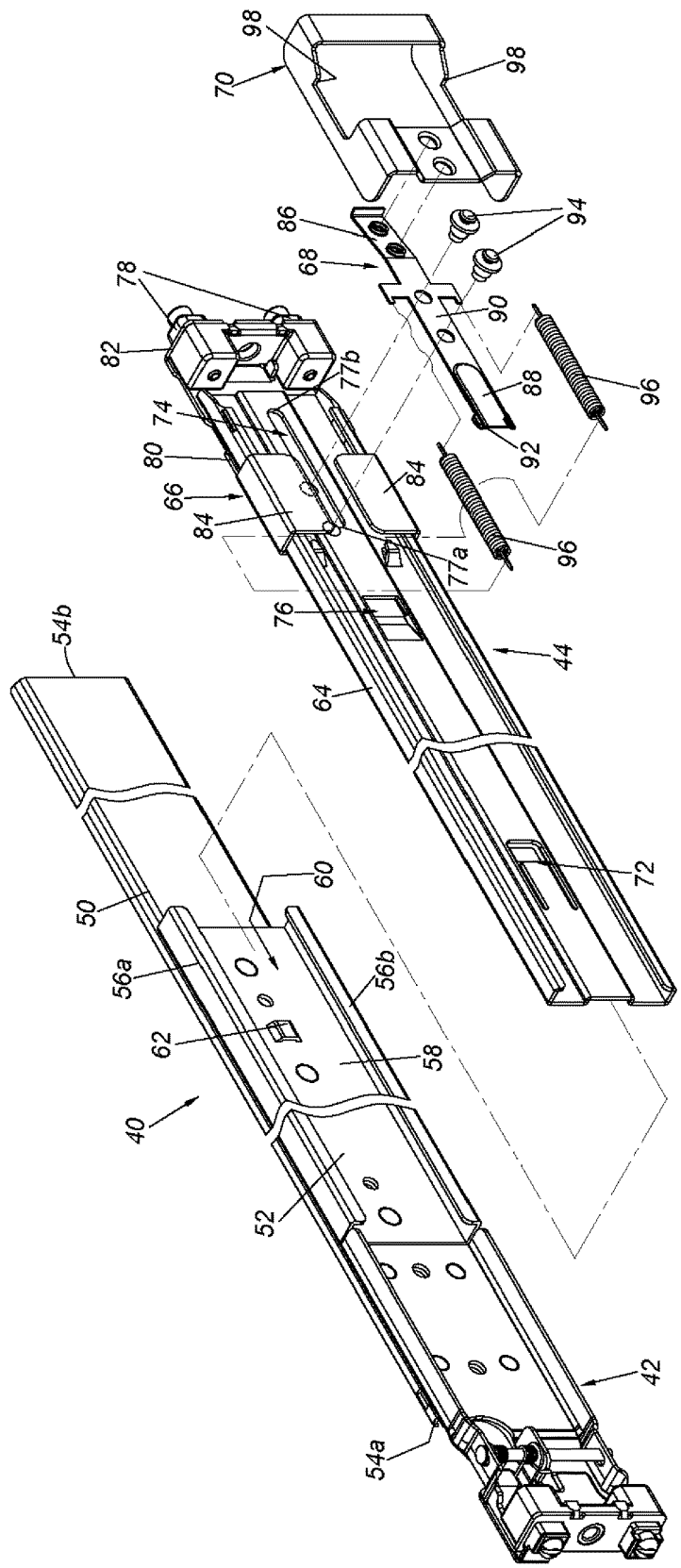
FIG. 3 is an exploded view of the slide rail assembly according to the first embodiment of the present invention.

As shown in FIG. 2 and FIG. 3, the slide rail assembly 40 comprises a rail member 50, a supporting rail 52, the first bracket 42 and the bracket device 44. The rail member 50 has a first end part 54a and a second end part 54b opposite to the first end part 54a. The supporting rail 52 is fixedly connected to a back board of the rail member 50, such that the supporting rail 52 can be seen as a portion of the rail member 50. The supporting rail 52 has an upper wall 56a, a lower wall 56b, and a longitudinal wall 58 connected between the upper wall 56a and the lower wall 56b. A passage 60 is defined by the upper wall 56a, the lower wall 56b and the longitudinal wall 58. The first bracket 42 is connected to the rail member 50 and adjacent to the first end part 54a of the rail member 50. Preferably, a first blocking part 62 is arranged on the longitudinal wall 58 of the supporting rail 52 within the passage 60. On the other hand, the bracket device 44 is located adjacent to the second end part 54b of the rail member 50. Wherein, the bracket device 44 comprises a supporting frame 64, a second bracket 66, an elastic member 68 and a fastening member 70.

The supporting frame 64 is movably mounted to the supporting rail 52, and is movable within the passage 60 of the supporting rail 52. In the present embodiment, the supporting frame 64 has a second blocking part 72 corresponding to the first blocking part 62 of the supporting rail 52. When mounting the supporting frame 64 to the supporting rail 52, the supporting frame 64 is inserted into the passage 60 of the supporting rail 52 to allow the second blocking part 72 to elastically contact and cross the first blocking part 62 of the supporting rail 52. Therefore, the second blocking part 72 is configured to abut against the first blocking part 62, such that the supporting frame 64 can be driven to move by the supporting rail 52. Preferably, the supporting frame 64 further comprises a limiting feature 74 and a first engaging feature 76 located between the second blocking part 72 and the limiting feature 74.

The second bracket 66 comprises at least one mounting member 78, such as comprising two mounting members 78. In the present embodiment, the second bracket 66 further comprises a side wall 80 and an end wall 82. The side wall 80 is connected (such as movably connected) to the supporting frame 64. The end wall 82 is substantially perpendicularly connected to the side wall 80. The at least one mounting member 78 is mounted to the end wall 82. Preferably, the side wall 80 is arranged with a pair of holding parts 84 respectively extended to upper and lower sides of the supporting frame 64.

The elastic member 68 is mounted to the supporting frame 64. The elastic member 68 comprises a first elastic part 86, a second elastic part 88 and a connecting part 90 connected between the first elastic part 86 and the second elastic part 88. Wherein, the first elastic part 86 is bent relative to the connecting part 90 in order to accumulate an elastic force. An end of the second elastic part 88 is arranged with at least one second engaging feature 92 (such as two second engaging features 92). The second engaging feature 92 is configured to be engaged with the first engaging feature 76 of the supporting frame 64. The connecting part 90 connects the elastic member 68 to the supporting frame 64 through at least one connecting member 94 (such as two connecting members 94). Specifically, the limiting feature 74 of the supporting frame 64 is a bounded elongated hole having a first boundary end 77a and a second boundary end 77b to allow the two connecting parts 94 to connect the elastic member 68 to the supporting frame 64. The elastic member 68 is movable within a limited range defined by the first and second boundary ends 77a, 77b of the limiting feature 74 and the two connecting parts 94.

In a preferred embodiment, the bracket device 44 further comprises at least one auxiliary elastic member 96 (such as comprising two auxiliary elastic members 96) connected between the supporting frame 64 and the elastic member 68.

The fastening member 70 is connected to the elastic member 68. For example, the fastening member 70 is connected to the first elastic part 86 of the elastic member 68, and the fastening member 70 has at least one fastening part 98 (such as two fastening parts 98).

Figure 4:
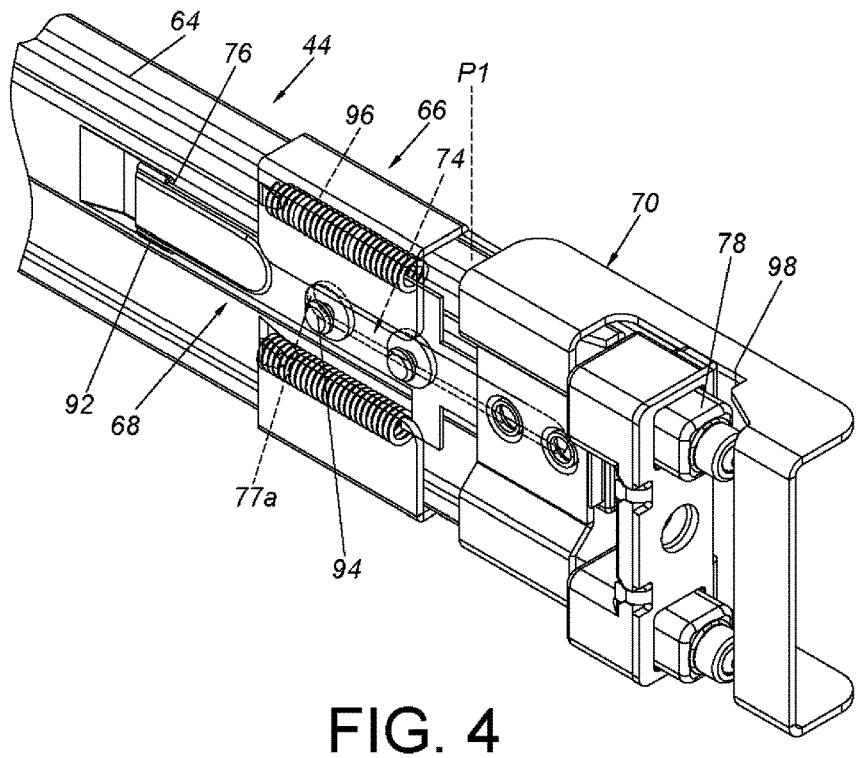
FIG. 4 is a diagram showing a fastening member of a bracket device in a locking state according to the first embodiment of the present invention.

As shown in FIG. 4, when the second engaging feature 92 of the elastic member 68 is engaged with the first engaging feature 76 of the supporting frame 64, the connecting member 94 is located adjacent to the first boundary end 77a of the limiting feature 74 of the supporting frame 64. The bracket device 44 is configured to hold the fastener member 70 in a locking state relative to the mounting member 78 through the auxiliary elastic member 96. Meanwhile, the second bracket 66 is located at a first position P1 relative to the supporting frame 64.

Figure 5:
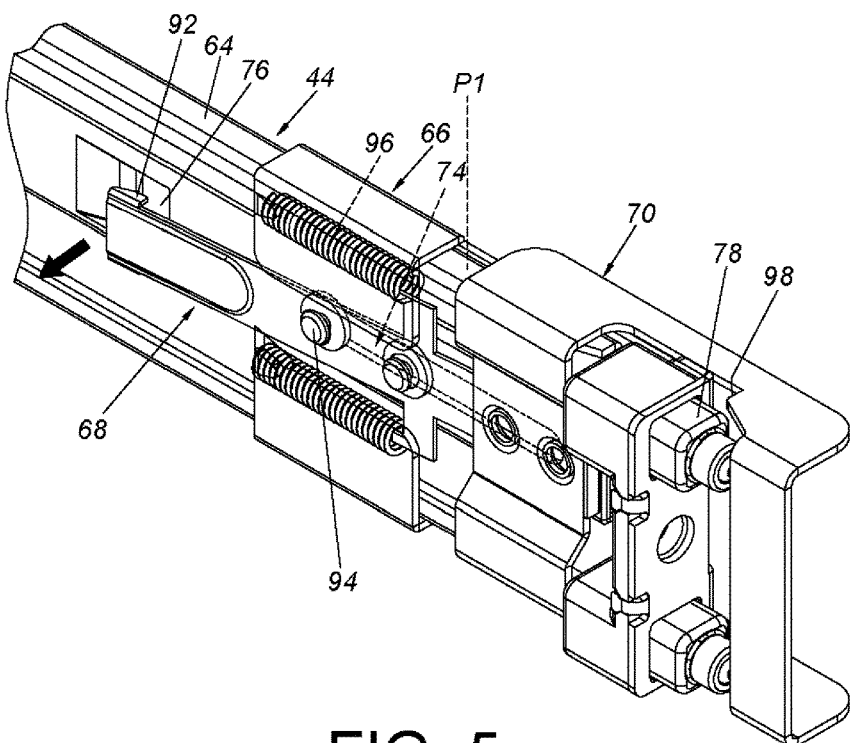
FIG. 5 is a diagram showing an elastic member of the bracket device being disengaged from the supporting frame according to the first embodiment of the present invention.

As shown in FIG. 5, an external force can be applied to the second engaging feature 92 of the elastic member 68 to disengage the second engaging feature 92 from the first engaging feature 76 of the supporting frame 64.

Figure 6:
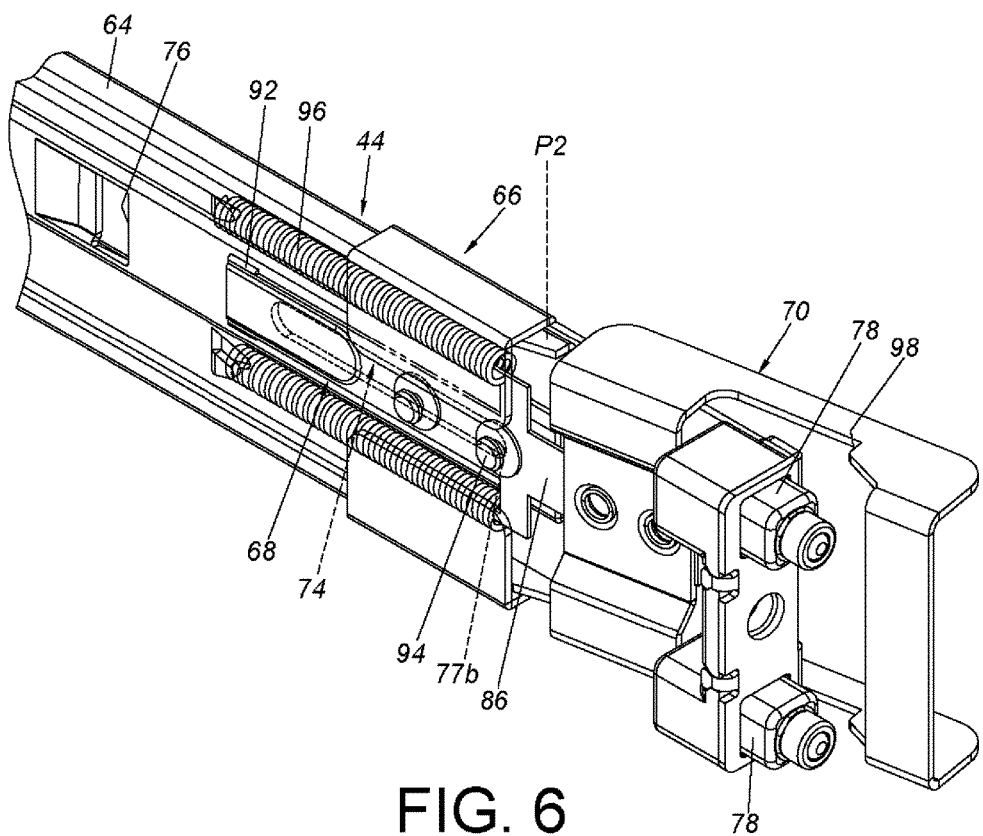
FIG. 6 is a diagram showing the fastening member of the bracket device in an unlocking state according to the first embodiment of the present invention.

As shown in FIG. 6, when the second engaging feature 92 of the elastic member 68 is disengaged from the first engaging feature 76 of the supporting frame 64, the auxiliary elastic member 96 releases an elastic force, such that the elastic member 68 is moved in response to the elastic force of the auxiliary elastic member 96. Meanwhile, the connecting member 94 is located adjacent to the second boundary end 77b of the limiting feature 74 of the supporting frame 64. The fastener member 70 of the bracket device 44 is deflected in response to the elastic force of the first elastic part 86 of the elastic member 68, such that the fastener member 70 is in an unlocking state relative to the mounting member 78. Meanwhile, the second bracket 66 is moved from the first position P1 to a second position P2 relative to the supporting frame 64.

Figure 7:
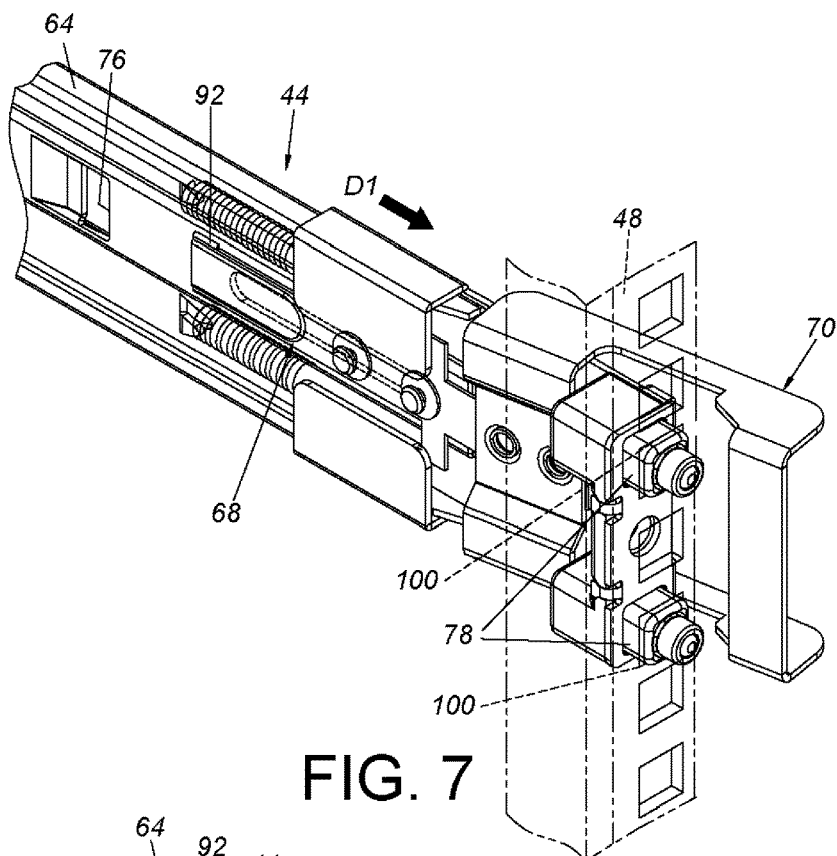
FIG. 7 is a diagram showing the bracket device being mounted to the second post of the rack without being locked to the second post according to the first embodiment of the present invention.

As shown in FIG. 7, when the fastener member 70 of the bracket device 44 is in the unlocking state, the two mounting members 78 of the bracket device 44 can be respectively inserted into two holes 100 of the second post 48 of the rack along a first direction D1.

Figure 8:
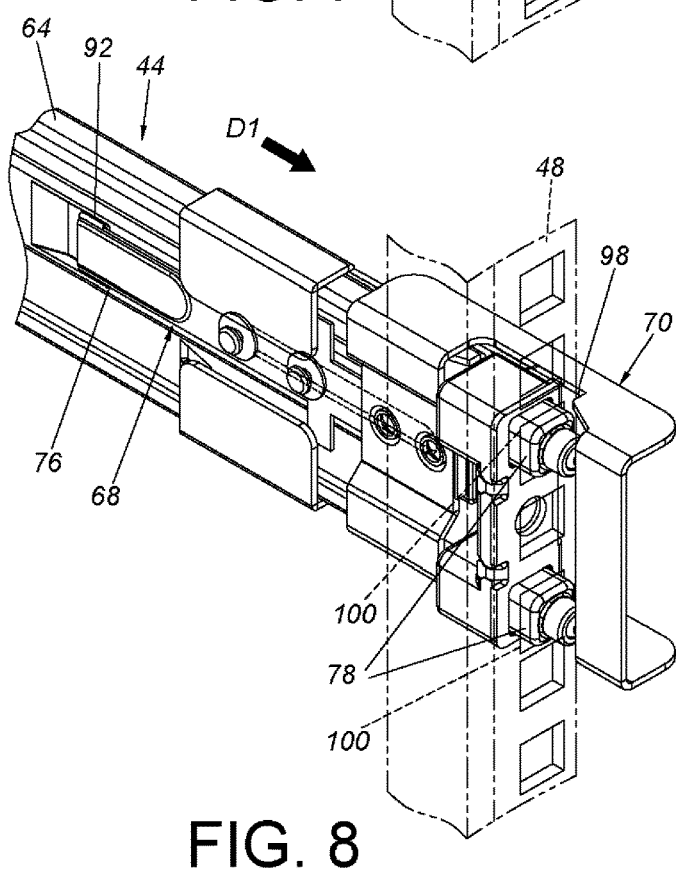
FIG. 8 is a diagram showing the bracket device being mounted and locked to the second post of the rack according to the first embodiment of the present invention.

As shown in FIG. 8, when an external force is further applied to the bracket device 44 along the first direction D1, the supporting frame 64 of the bracket device 44 is driven to move relative to the second post 48, such that the first engaging feature 76 of the supporting frame 64 is engaged with the second engaging feature 92 of the elastic member 68. Thus the fastener member 70 is driven to switch from the unlocking state to the locking state by the elastic force of the auxiliary elastic member 96, so that the bracket device 44 is locked to the second post 48. Meanwhile, the fastener part 98 of the fastener member 70 corresponds to a portion of the second post 48, so as to stably mount the bracket device 44 to the second post 48.

Figure 9:
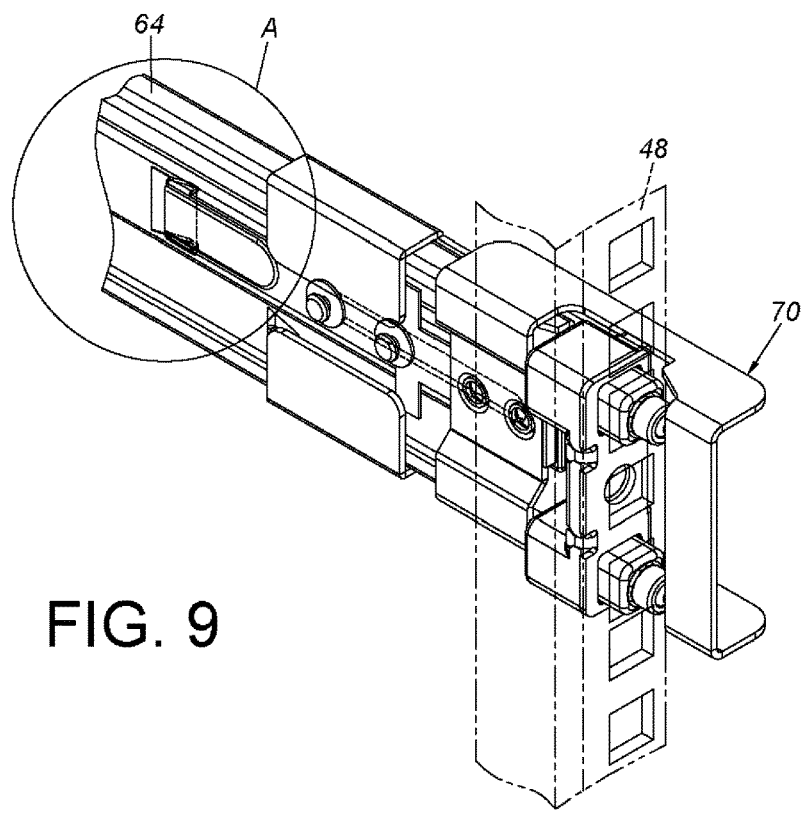
FIG. 9 is a diagram showing the bracket device being mounted and locked to the second post of the rack with the elastic member being engaged with the supporting frame according to the first embodiment of the present invention.
Figure 10:
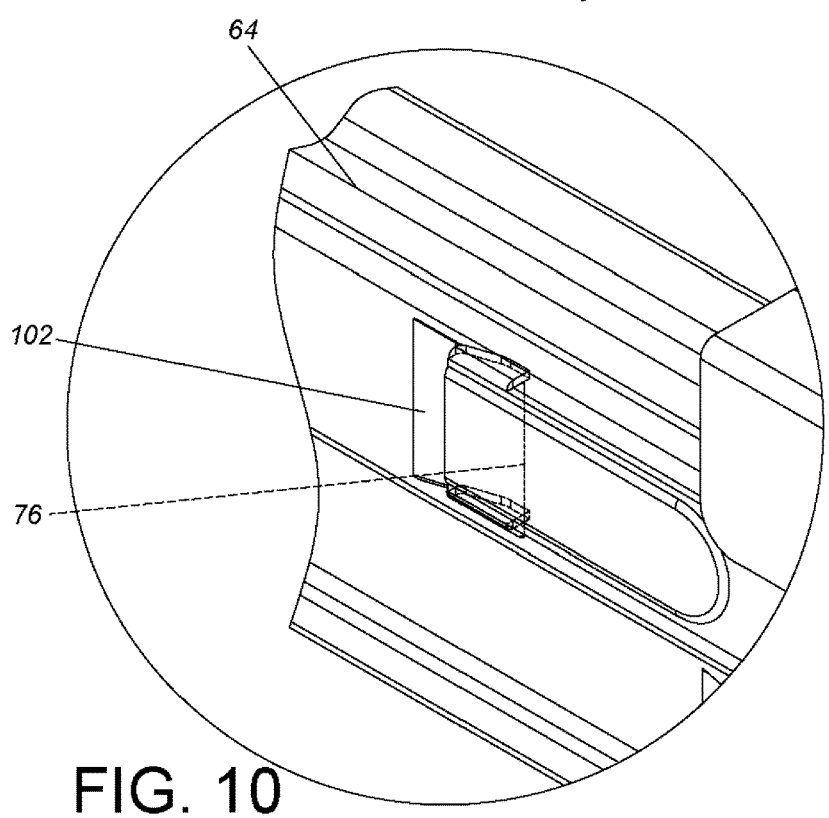
FIG. 10 is an enlarged view of an area A of FIG. 9.

As show in FIG. 9 and FIG. 10, an unlocking part 102 is arranged on the supporting frame 64 of the bracket device 44 and adjacent to the first engaging feature 76. Preferably, the unlocking part 102 has an inclined surface or an arc surface.

Figure 11:
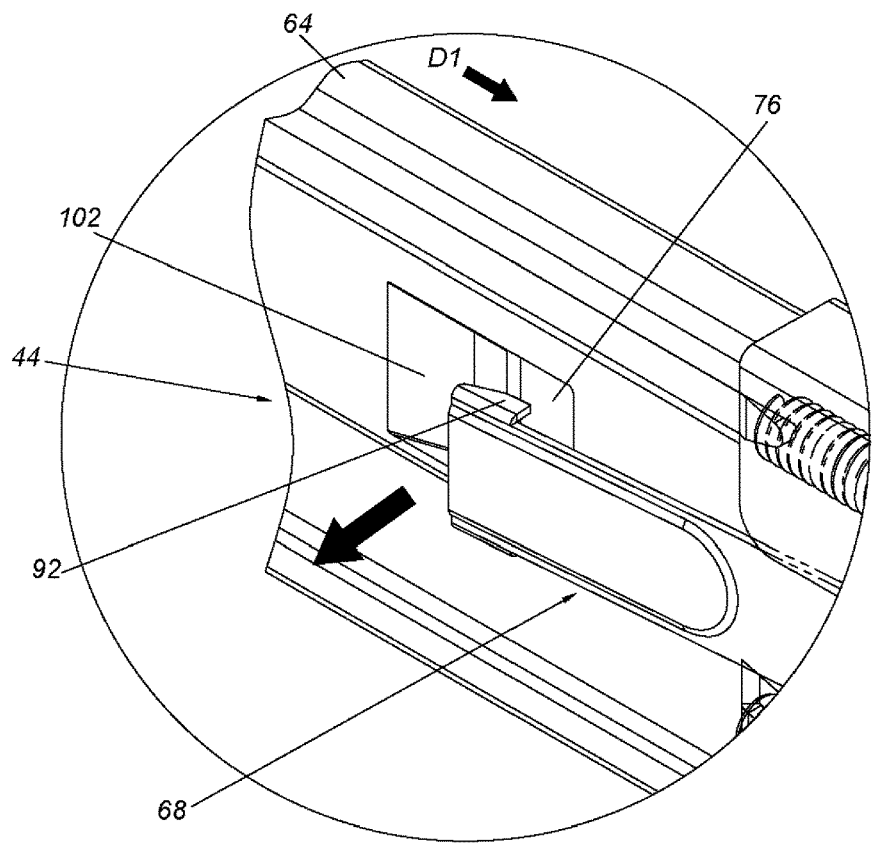
FIG. 11 is a diagram showing the elastic member being disengaged from the supporting frame according to the first embodiment of the present invention.
Figure 12:
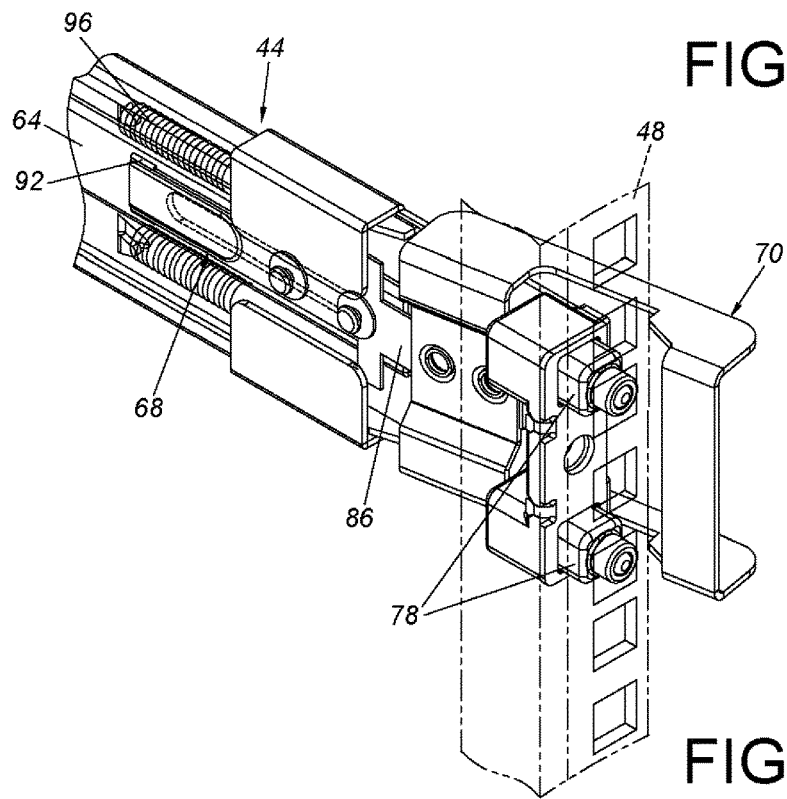
FIG. 12 is a diagram showing the fastening member of the bracket device unlocking the second post according to the first embodiment of the present invention.
Figures 15, 16:
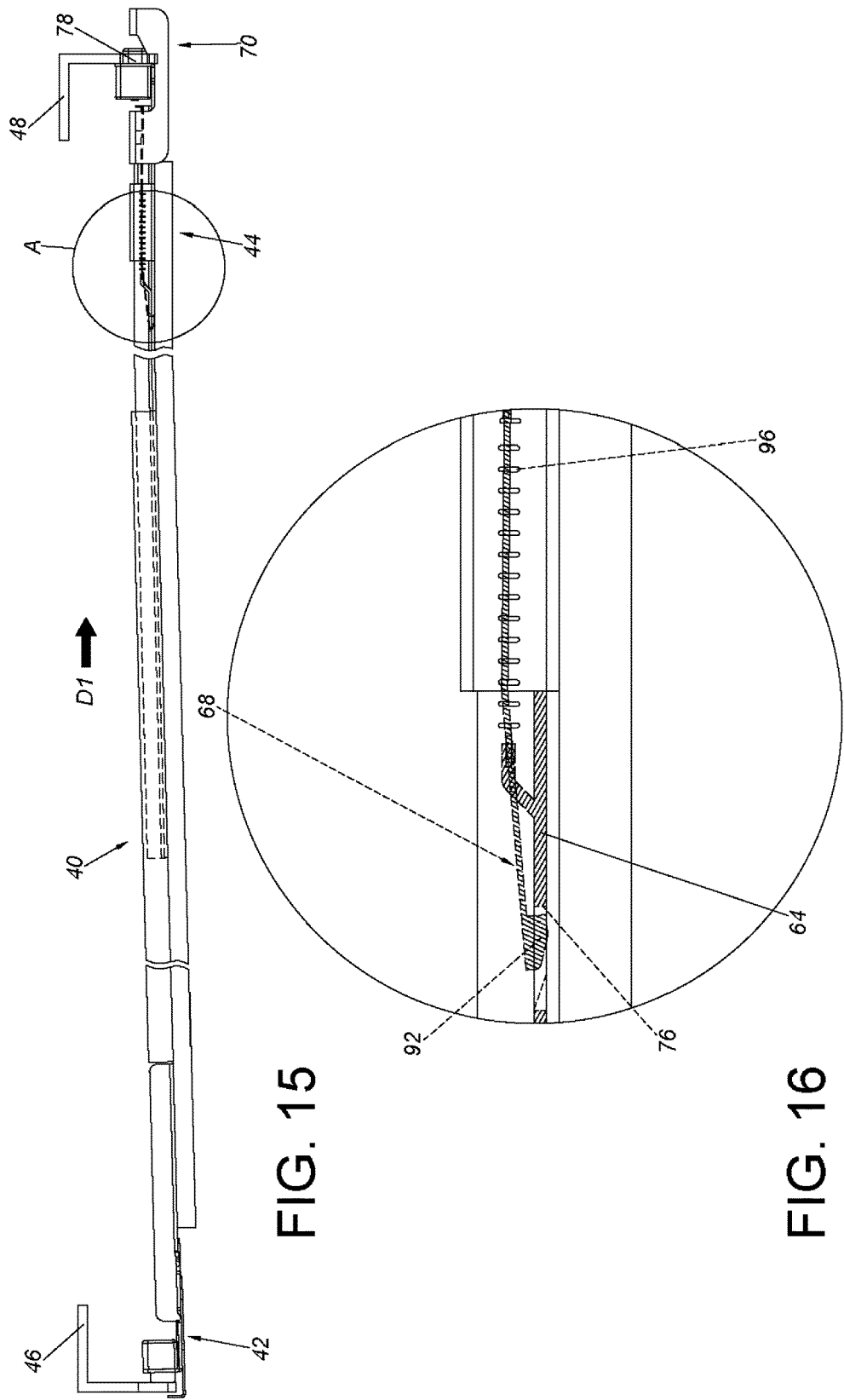
FIG. 15 is a diagram showing the bracket device being mounted and locked to the second post according to the first embodiment of the present invention.
FIG. 16 is an enlarged view of an area A of FIG. 15.
Figure 17:
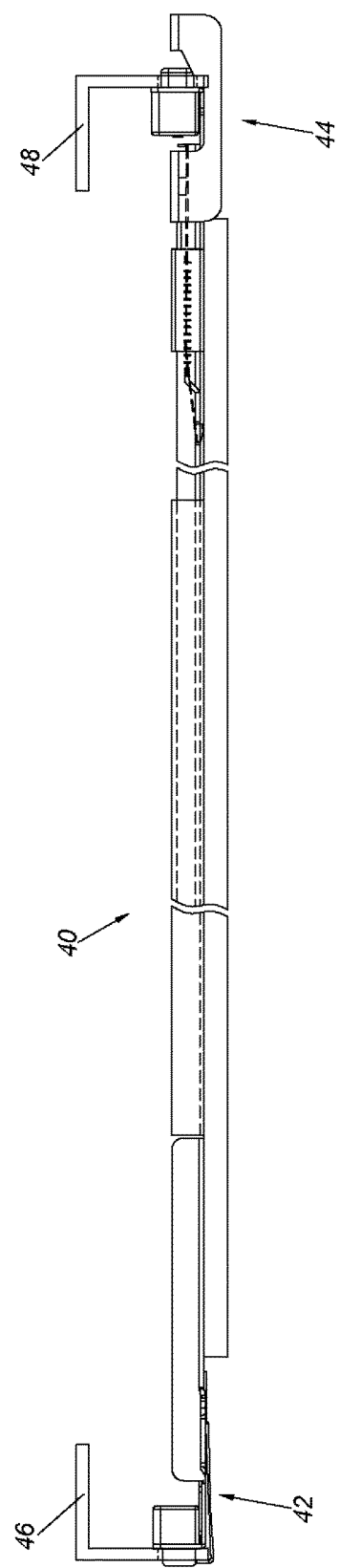
FIG. 17 is a diagram showing the slide rail assembly being mounted to the first post and the second post of the rack according to the first embodiment of the present invention.

As shown in FIG. 11 and FIG. 12, in order to unlock the bracket device 44, an external force can be applied to the bracket device 44 along the first direction D1 for driving the supporting frame 64 of the bracket device 44 to abut against the elastic member 68 through the unlocking part 102, such that the second engaging feature 92 of the elastic member 68 is disengaged from the first engaging feature 76 of the supporting frame 64. The auxiliary elastic member 96 then releases the elastic force immediately, such that the elastic member 68 is moved in response to the elastic force of the auxiliary elastic member 96. The fastener member 70 is further deflected in response to the elastic force of the first elastic part 86 of the elastic member 68, such that the fastener member 70 is in the unlocking state relative to the mounting member 78. As such, the bracket device 44 is able to be detached from the second post 48.

FIG. 13 to FIG. 17 are diagrams showing operations of mounting the slide rail assembly 40 to the first post 46 and the second post 48. First, the fastener member 70 of the bracket device 44 is operated to be in the unlocking state. Thereafter, the mounting member 78 of the bracket device 44 is inserted into the holes of the second post 48. When an external force is further applied to the bracket device 44 along the first direction D1, the supporting frame 64 of the bracket device 44 is driven to move relative to the second post 48, such that the first engaging feature 76 of the supporting frame 64 is engaged with the second engaging feature 92 of the elastic member 68. Thus the fastener member 70 is driven to switch from the unlocking state to the locking state by the elastic force of the auxiliary elastic member 96, such that the bracket device 44 is locked to the second post 48. Thereafter, the first bracket 42 can be further mounted to the first post 46, so as to stably mount the slide rail assembly 40 to the first post 46 and the second post 48.

Figure 18:
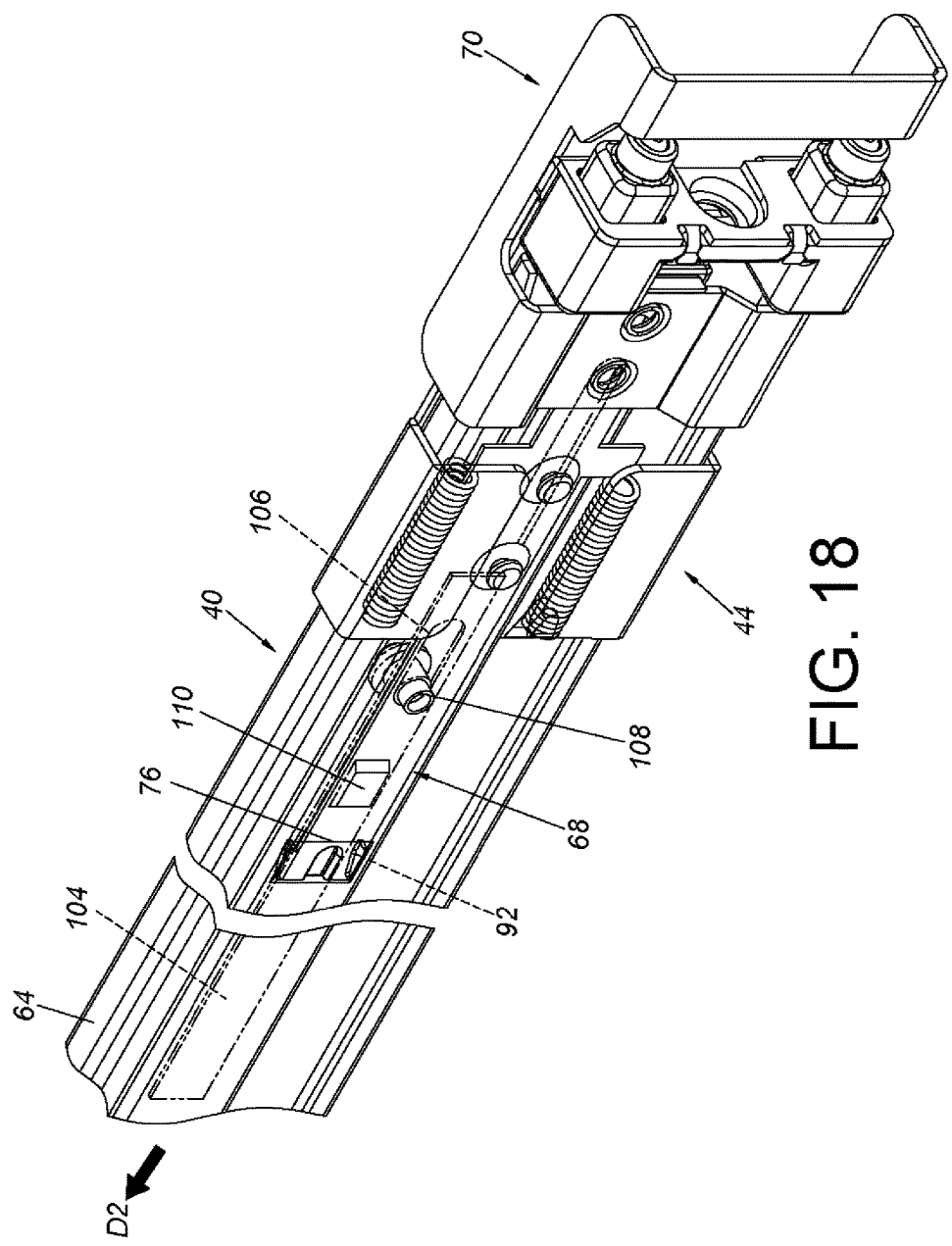
FIG. 18 is a diagram showing the bracket device further comprising an operating member according to the first embodiment of the present invention, where the fastening member is in the locking state.
Figure 19:
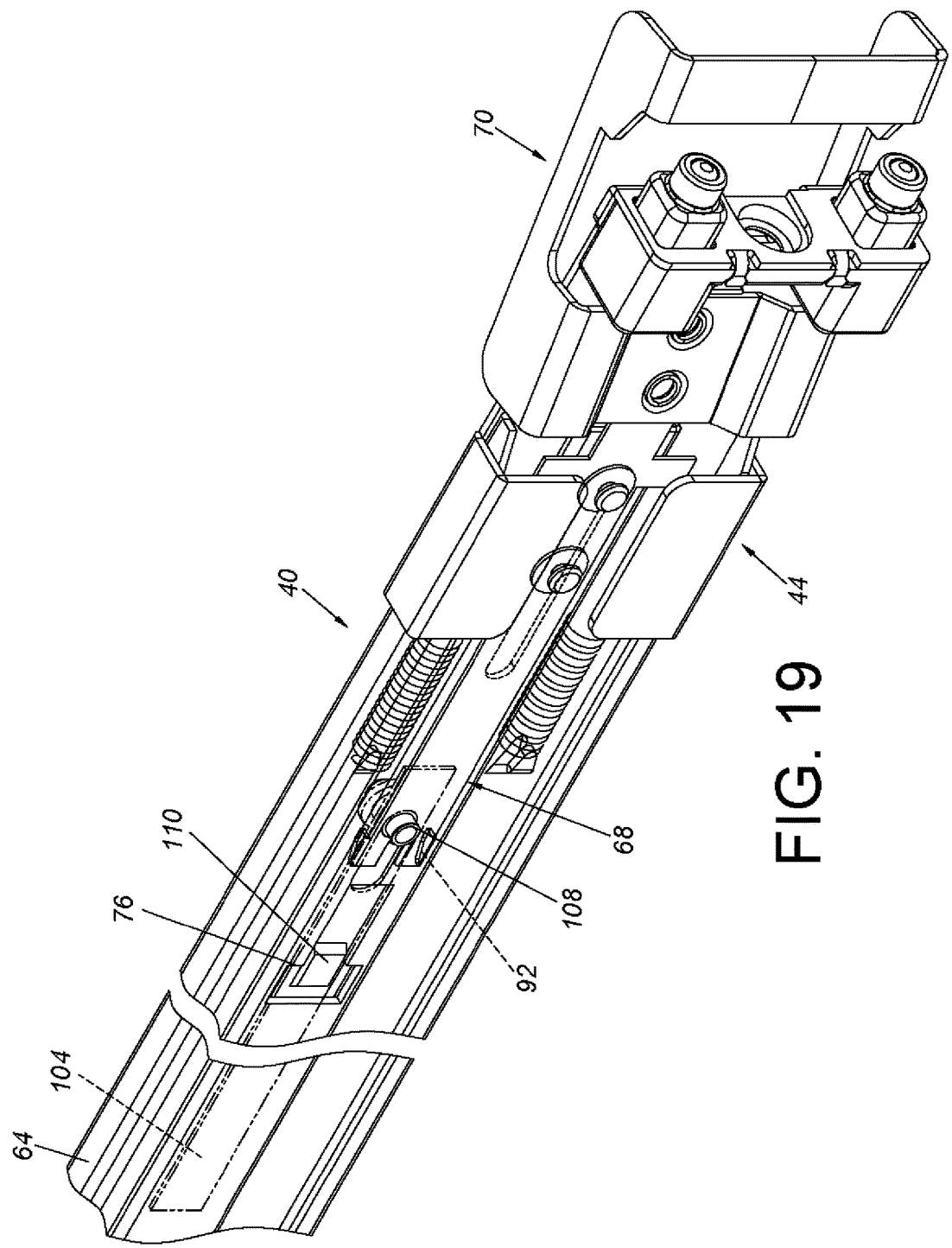
FIG. 19 is a diagram showing the bracket device being operated by the operating member according to the first embodiment of the present invention, where the fastening member is switched from the locking state to the unlocking state.

As shown in FIG. 18 and FIG. 19, the slide rail assembly 40 further comprises an operating member 104 movably mounted to the supporting frame 64 of the bracket device 44. For example, the operating member 104 has a bounded longitudinal hole 106, and a connecting member 108 is configured to pass through the longitudinal hole 106 to connect the operating member 104 to the supporting frame 64. As such, the operating member 104 can be operated to move relative to the supporting frame 64. The operating member 104 comprises an unlocking part 110 corresponding to the second engaging feature 92 of the elastic member 68. When the operating member 104 is operated to move along a second direction D2, the second engaging feature 92 of the elastic member 68 is disengaged from the first engaging feature 76 of the supporting frame 64 by the unlocking part 110 of the operating member 104. As such, the fastener member 70 of the bracket device 44 is driven to switch from the locking state to the unlocking state, in order to allow the bracket device 44 to be mounted to the second post 48. Please refer to FIGS. 13 to 17 for related operations.

Figure 20:
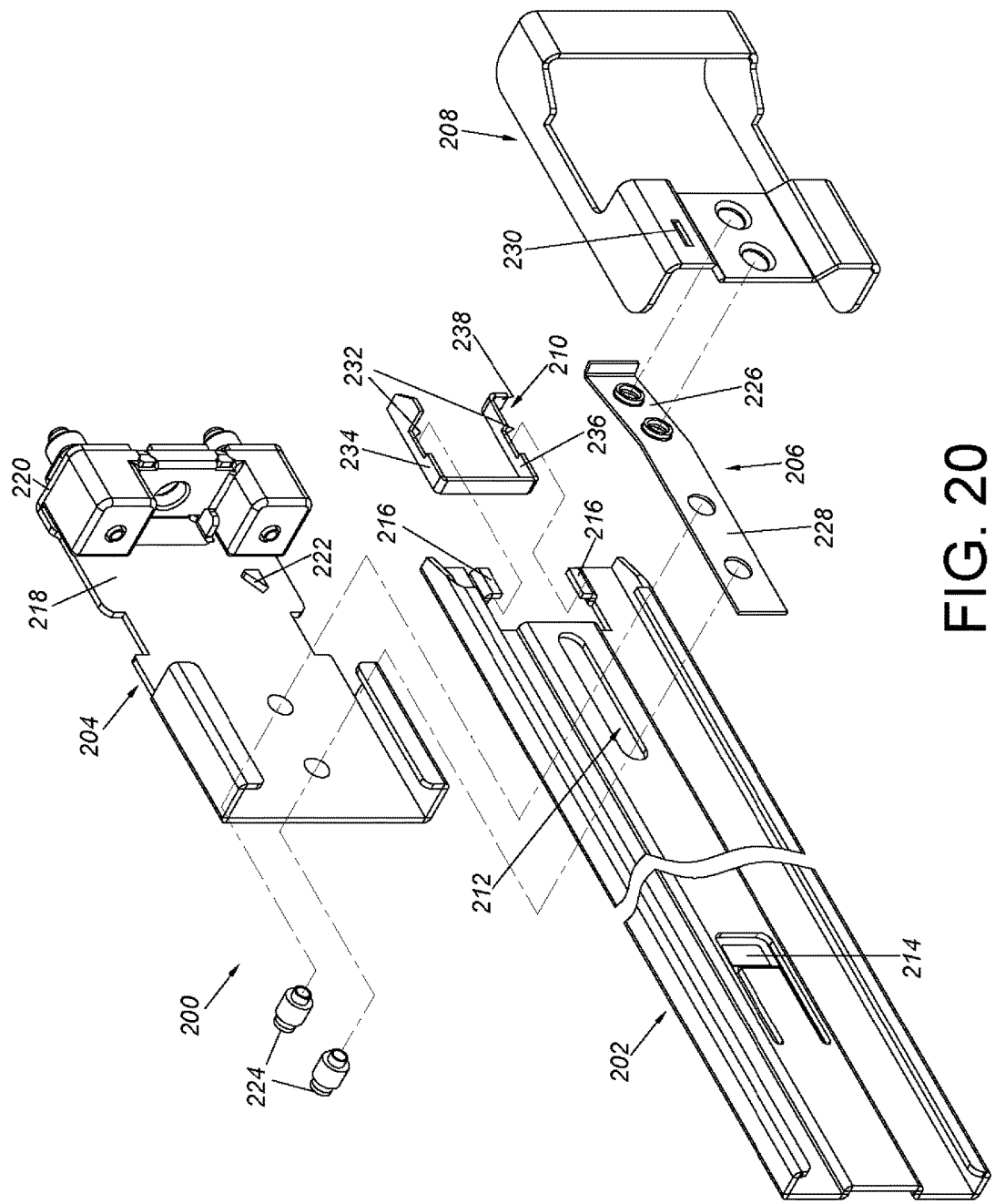
FIG. 20 is an exploded view of a bracket device according to a second embodiment of the present invention.
Figure 21:
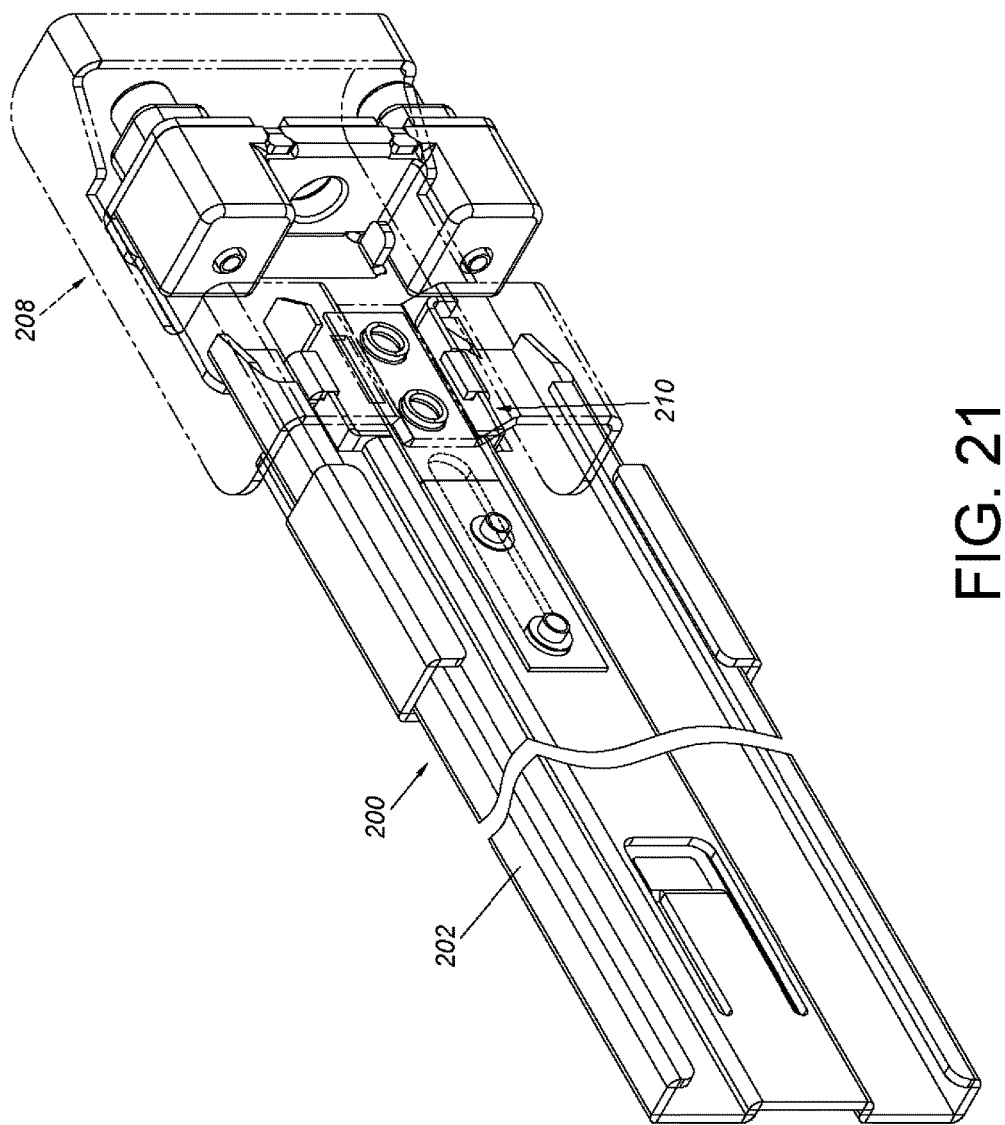
FIG. 21 is a diagram showing the bracket device according to the second embodiment of the present invention.

FIG. 20 and FIG. 21 are diagrams showing a bracket device 200 of the slide rail assembly according to a second embodiment of the present invention. The bracket device 200 comprises a supporting frame 202, a second bracket 204, an elastic member 206, a fastening member 208 and an auxiliary elastic member 210.

The supporting frame 202 comprises a limiting feature 212 and a second blocking part 214 substantially identical to those of the supporting frame 64 of the first embodiment. In the present embodiment, the supporting frame 202 is not arranged with the first engaging feature 76 of the supporting frame 64 of the first embodiment. An end of the supporting frame 202 is arranged with at least one first mounting feature 216 (such as two first mounting features 216). The first mounting feature 216 is a protrusion in the present embodiment.

The second bracket 204 comprises a side wall 218 and an end wall 220 substantially identical to those of the second bracket 66 of the first embodiment. Different from the second bracket 66 of the first embodiment is that the side wall 218 is further arranged with a stopping part 222. The stopping part 222 is a protrusion in the present embodiment.

The elastic member 206 is connected to the second bracket 204 and the supporting frame 202 through two connecting members 224. Wherein, the elastic member 206 comprises a first elastic part 226 and a connecting part 228. Arrangement between the first elastic part 226 and the connecting part 228 is substantially identical to that of the first embodiment, thus no further illustration is provided.

The fastener member 208 is similar to the fastener member 70 of the first embodiment. The fastener member 208 is connected to the elastic member 206, For example, the fastener member 208 is connected to the first elastic part 226 of the elastic member 206. Different from the fastener member 70 of the first embodiment is that the fastener member 208 is further arranged with an auxiliary feature 230, such as a hole or a non-enclosed opening.

The auxiliary elastic member 210 is mounted to the supporting frame 202. The auxiliary elastic member 210 comprises at least one second mounting feature 232 (such as two second mounting features 232). In the present embodiment, the second mounting feature 232 is a concave part. Through engaging the first mounting features 216 with the second mounting feature 232, the auxiliary elastic member 210 can be mounted to the supporting frame 202. The auxiliary elastic member 210 comprises a supporting leg 234 and an elastic leg 236. Each of the supporting leg 234 and the elastic leg 236 is arranged with the second mounting feature 232. Wherein, an end of the elastic leg 236 is arranged with a bending part 238.

Figure 22:
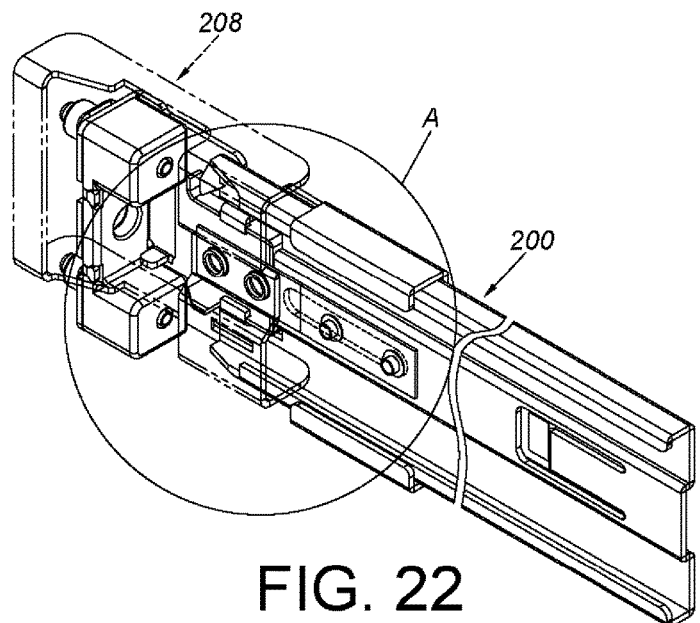
FIG. 22 is a diagram showing the bracket device in another angle according to the second embodiment of the present invention.
Figure 23:
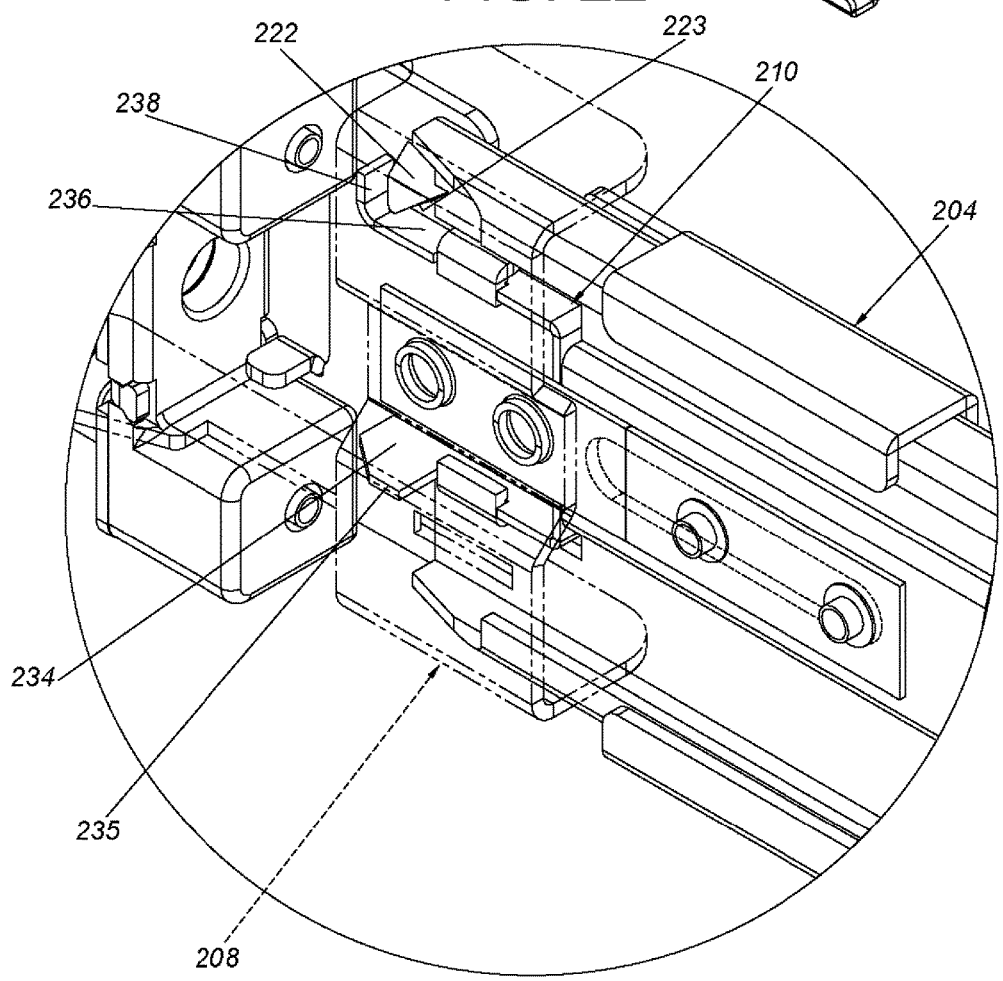
FIG. 23 is an enlarged view of an area A of FIG. 22.

As shown in FIG. 22 and FIG. 23, when the fastening member 208 of the bracket device 200 is in the locking state, the bending part 238 of the elastic leg 236 of the auxiliary elastic member 210 is configured to abut against the stopping part 222 of the second bracket 204, in order to hold the fastening member 208 in the locking state. Preferably, the stopping part 222 has an inclined surface 223 configured to allow the bending part 238 of the elastic leg 236 to easily elastically cross the stopping part 222 in order to further abut against the stopping part 222. On the other hand, the fastening member 208 is adjacent to or configured to abut against a top face 235 of the supporting leg 234 of the auxiliary elastic member 210. Through limitation between the supporting leg 234 and the fastening member 208, the fastening member 208 cannot be operated to move, in order to hold the fastening member 208 in the locking state.

Figure 24:
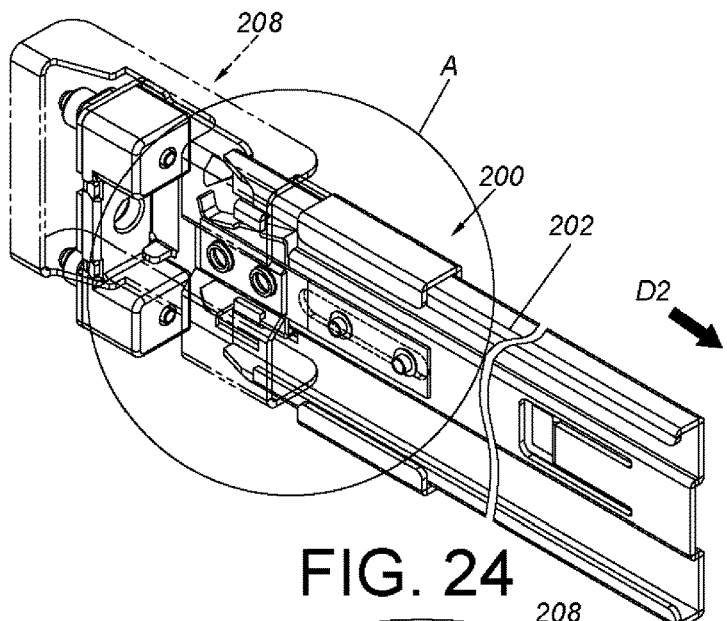
FIG. 24 is a diagram showing a supporting frame of the bracket device being moved along a direction according to the second embodiment of the present invention.
Figure 25:
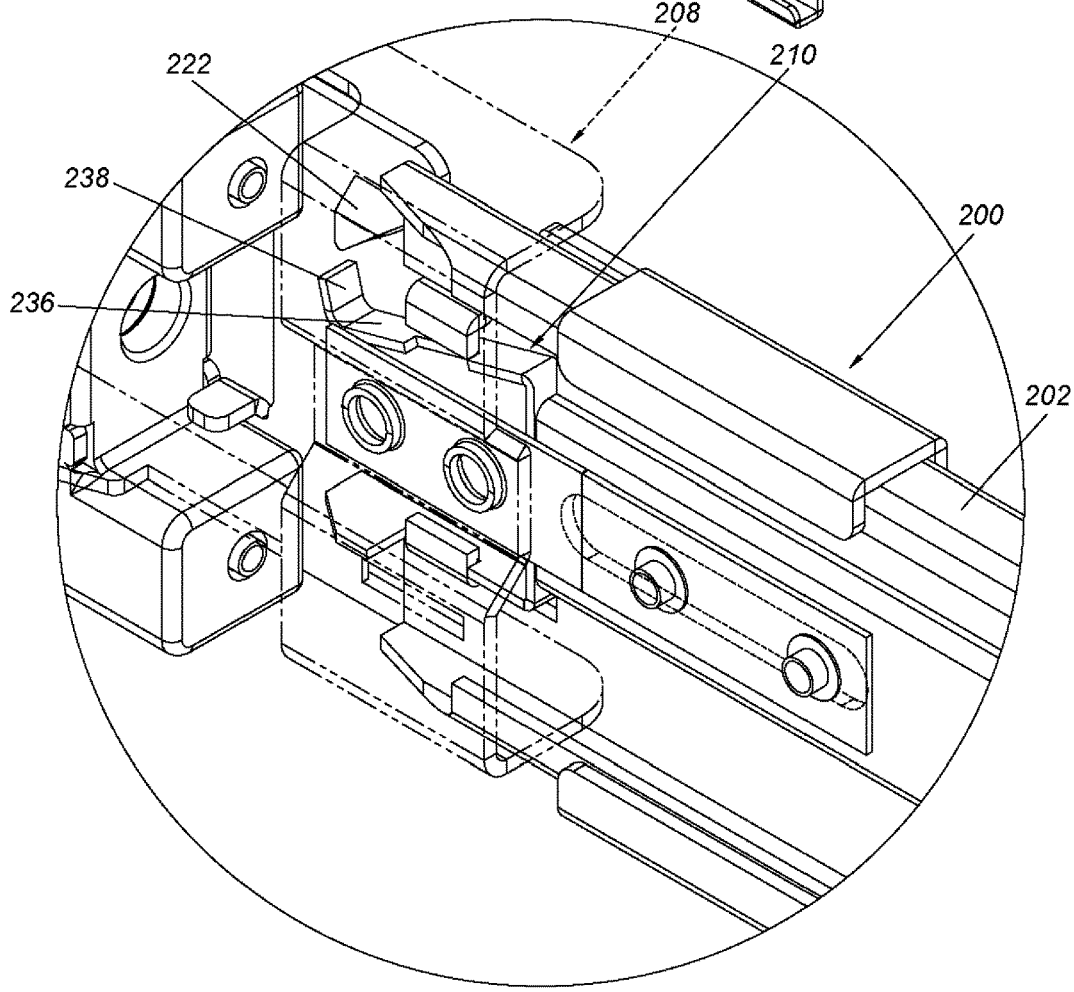
FIG. 25 is an enlarged view of an area A of FIG. 24.

As shown in FIG. 24 and FIG. 25, when an external force is applied to the supporting frame 202 of the bracket device 200 along the second direction D2, the auxiliary elastic member 210 is driven to move by the supporting frame 202, such that the bending part 238 of the elastic leg 236 of the auxiliary elastic member 210, which originally abuts against the stopping part 222 of the second bracket 204, is elastically deformed to disengage from the stopping part 222.

Figure 26:
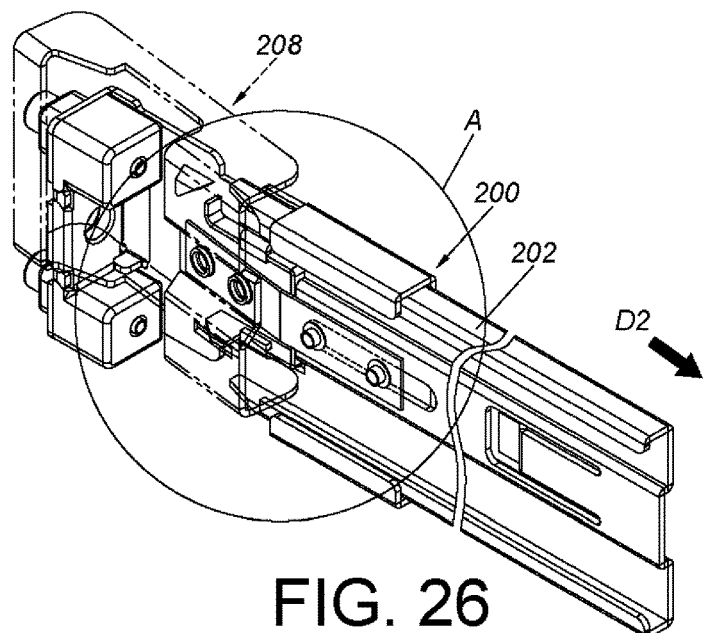
FIG. 26 is a diagram showing a fastening member of the bracket device in an unlocking state according to the second embodiment of the present invention.
Figure 27:
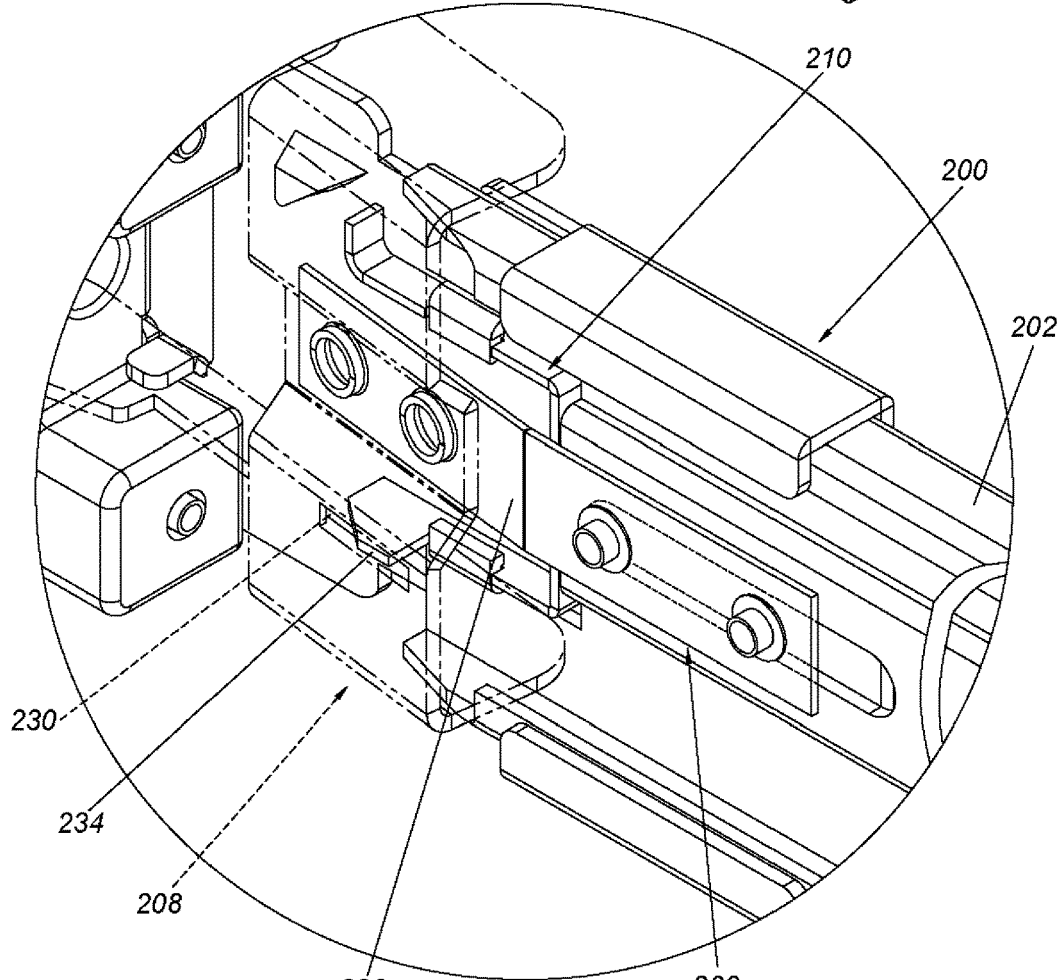
FIG. 27 is an enlarged view of an area A of FIG. 26.

As shown in FIG. 26 and FIG. 27, when the external force is still applied to the supporting frame 202 of the bracket device 200 along the second direction D2, the auxiliary elastic member 210 is driven to move by the supporting frame 202 to allow the top face 235 of the supporting leg 234 of the auxiliary elastic member 210 to face the auxiliary feature 230 of the fastening member 208, such that the fastening member 208 is driven to switch from the locking state to the unlocking state by the elastic force of the first elastic part 226 of the elastic member 206, and the fastening member 208 is further held in the unlocking state. On the other hand, the auxiliary feature 230 can also be a non-enclosed opening. Through the elastic force of the first elastic part 226 of the elastic member 206, the fastening member 208 can also be driven to switch from the locking state to the unlocking state, and held in the unlocking state.

Figure 28:
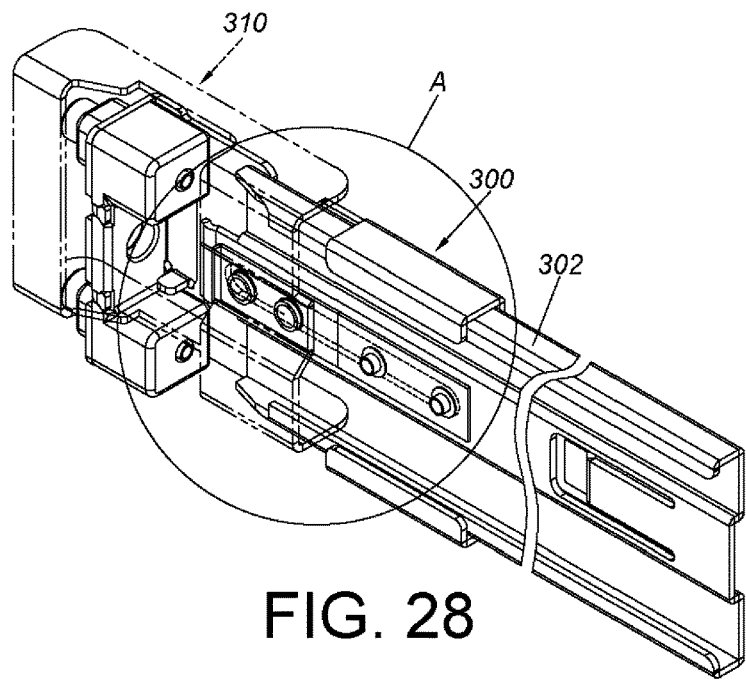
FIG. 28 is a diagram showing a fastening member of a bracket device in a locking state according to a third embodiment of the present invention.
Figure 29:
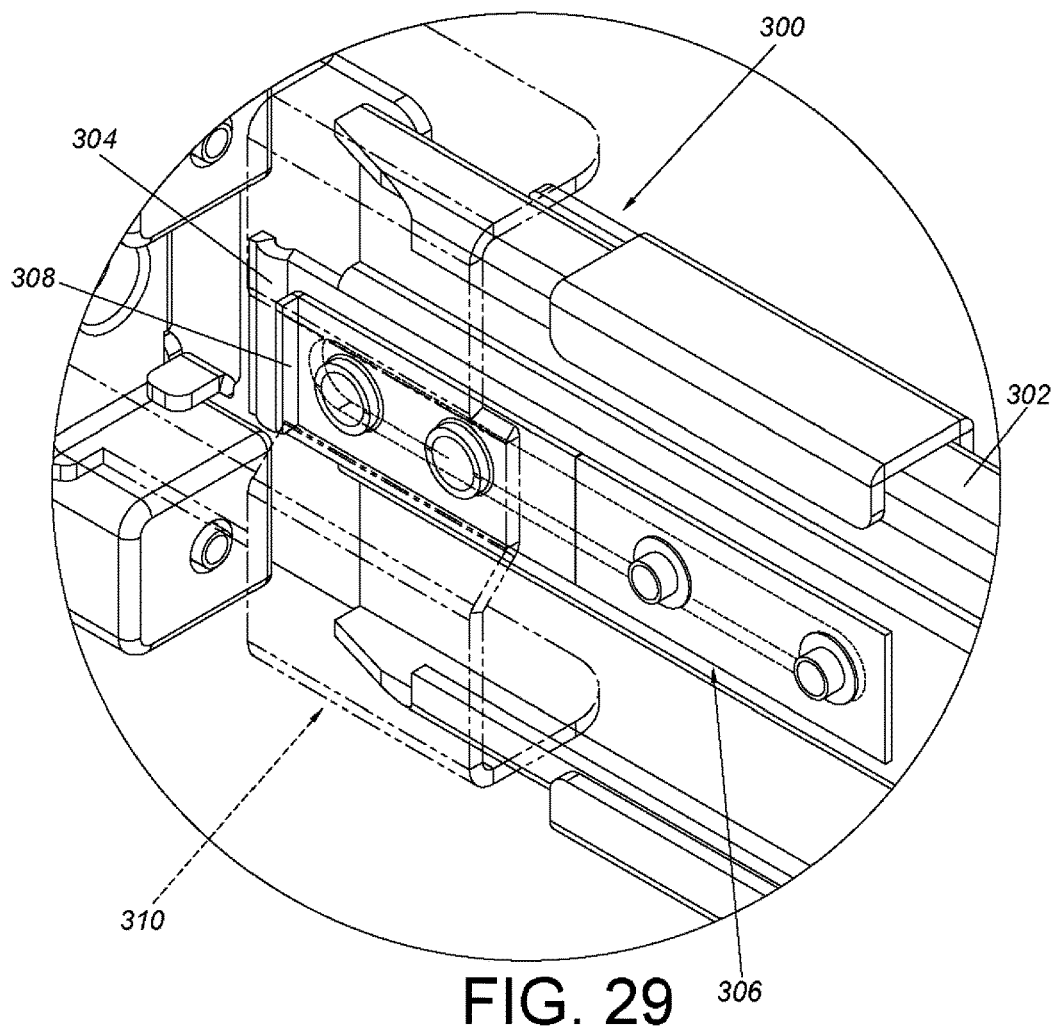
FIG. 29 is an enlarged view of an area A of FIG. 28.

FIG. 28 and FIG. 29 are diagrams showing a bracket device 300 according to a third embodiment of the present invention. Different from the bracket device 200 of the second embodiment is that the auxiliary elastic member 210 of the second embodiment is removed, and end parts of a supporting frame 302 and an elastic member 306 of the bracket device 300 are respectively arranged with a first stopping feature 304 and a second stopping feature 308 instead. When a fastening member 310 of the bracket device 300 is in the locking state, the first stopping feature 304 abuts against the second stopping feature 308, so as to hold the fastening member 310 of the bracket device 300 in the locking state.

Figure 30:
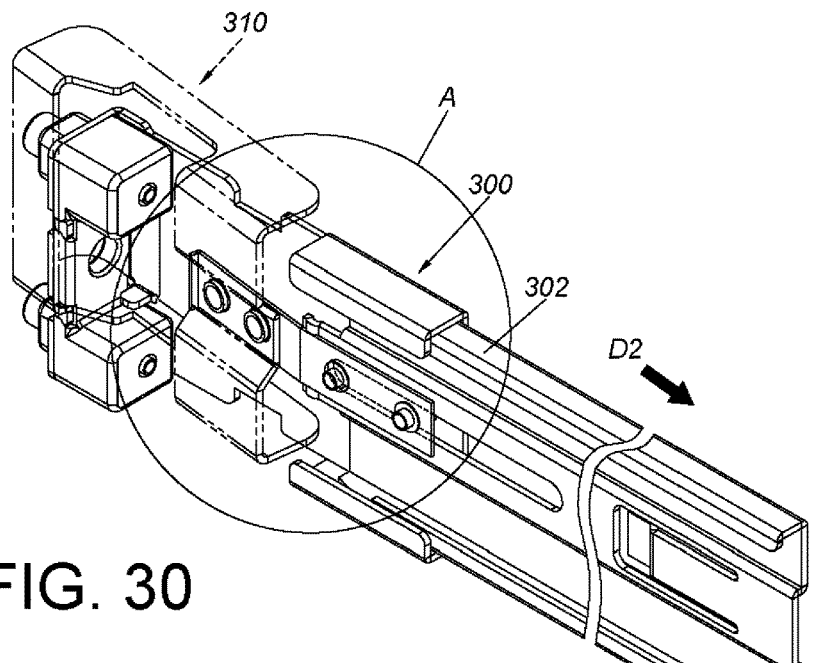
FIG. 30 is a diagram showing the fastening member of the bracket device in an unlocking state according to the third embodiment of the present invention.
Figure 31:
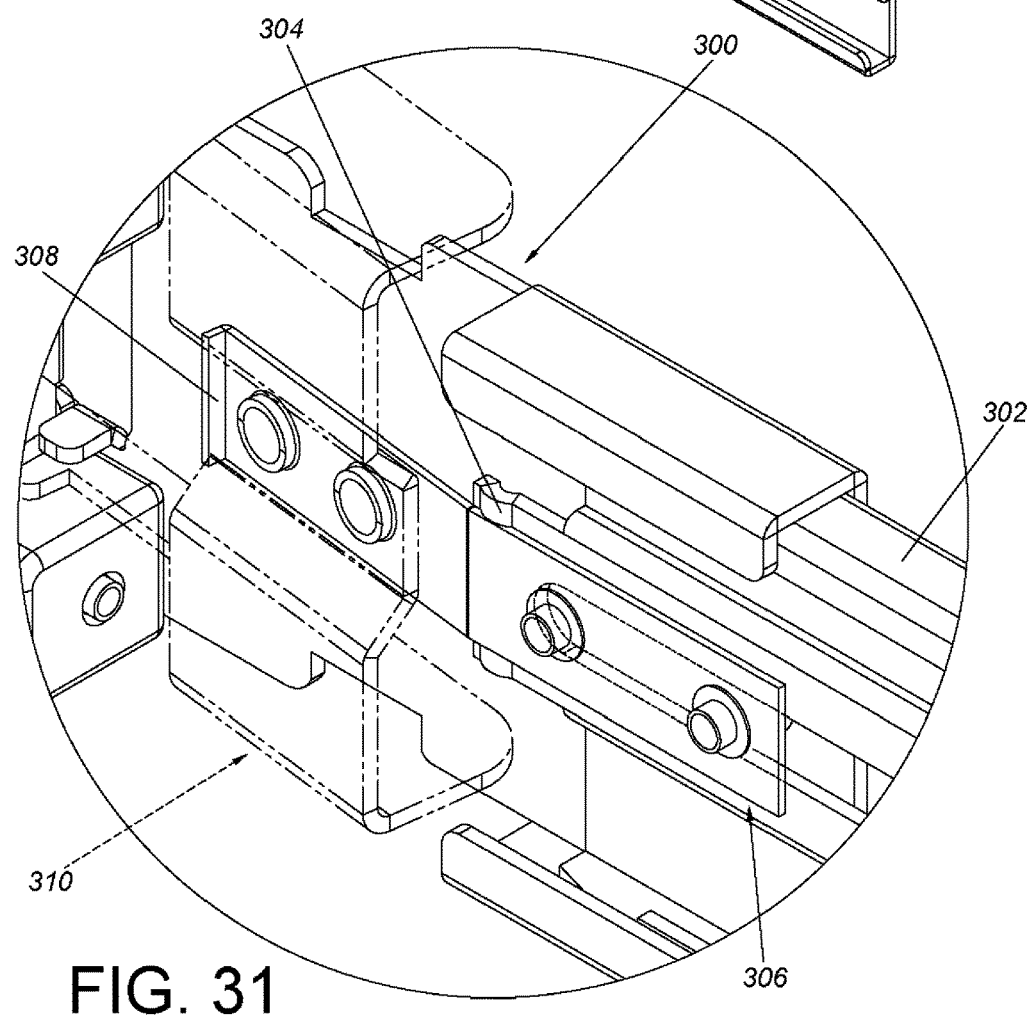
FIG. 31 is an enlarged view of an area A of FIG. 30.
Figure 32:
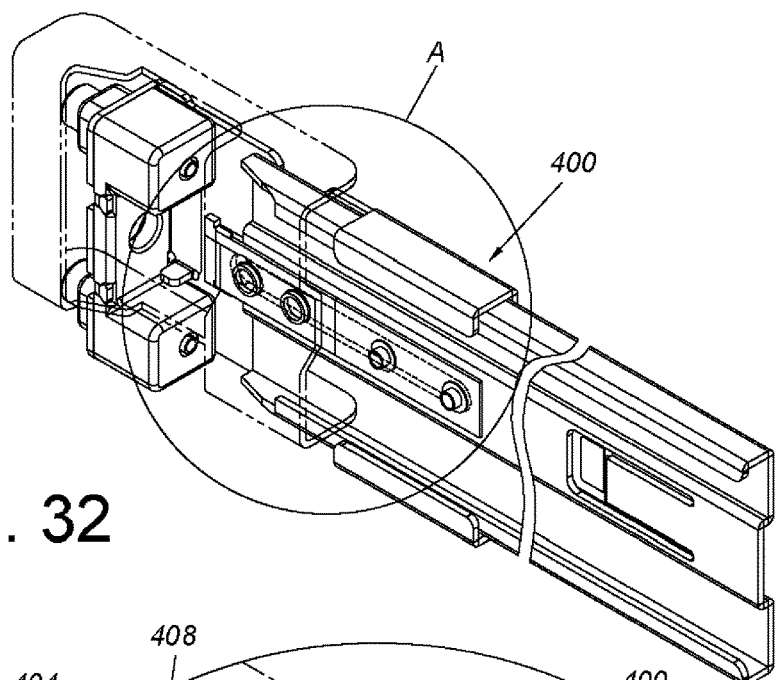
FIG. 32 is a diagram showing a fastening member of a bracket device in a locking state according to a fourth embodiment of the present invention.
Figure 33:
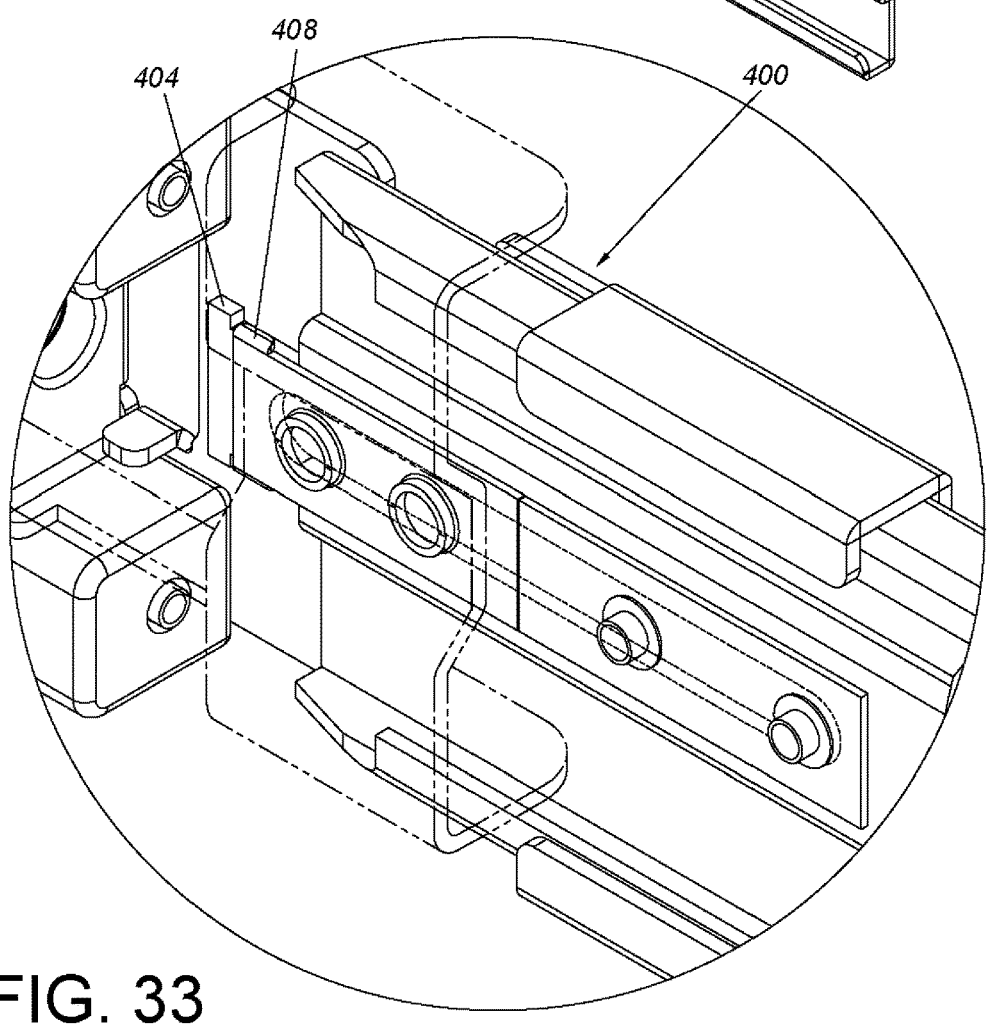
FIG. 33 is an enlarged view of an area A of FIG. 32.
Figure 34:
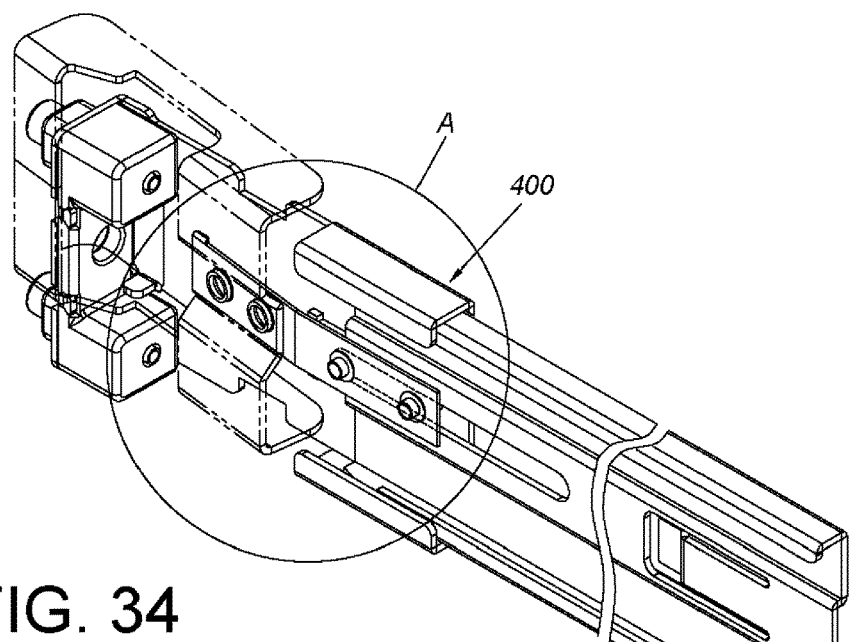
FIG. 34 is a diagram showing the fastening member of the bracket device in an unlocking state according to the fourth embodiment of the present invention.
Figure 35:
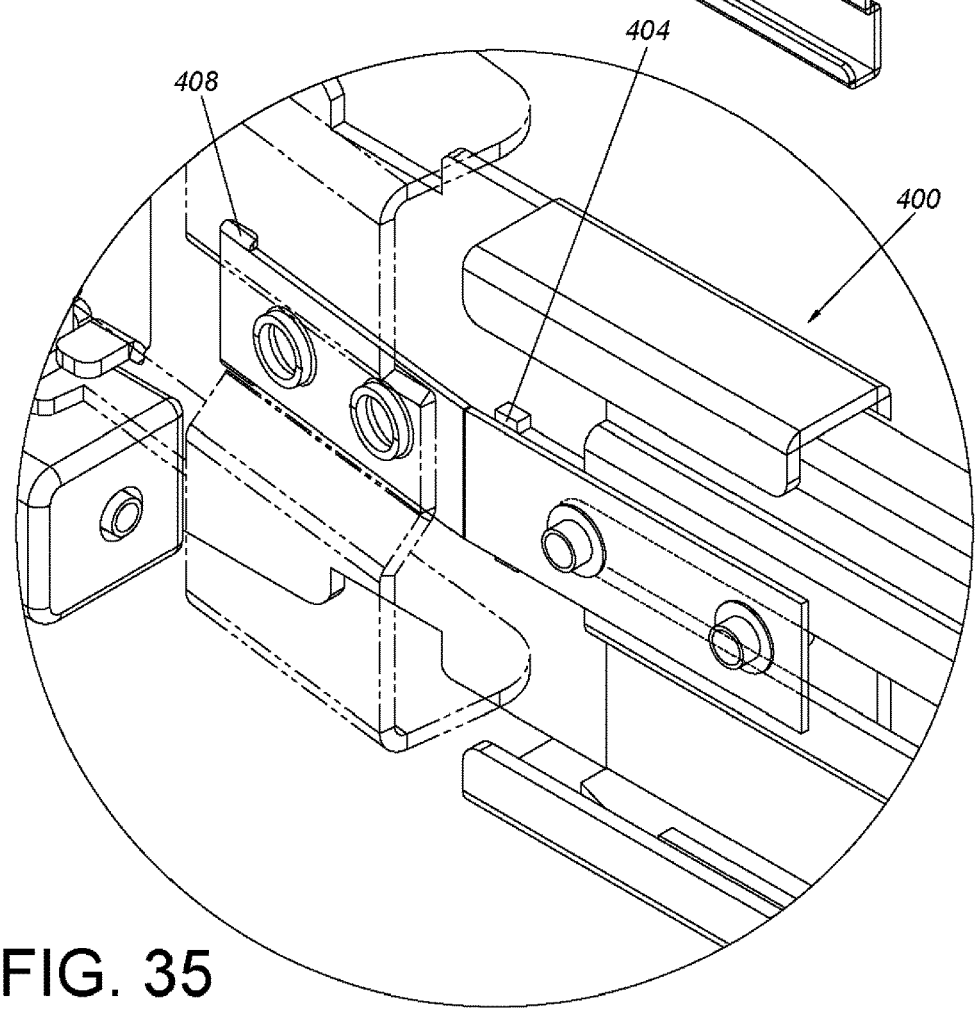
FIG. 35 is an enlarged view of an area A of FIG. 34.
Figure 36:
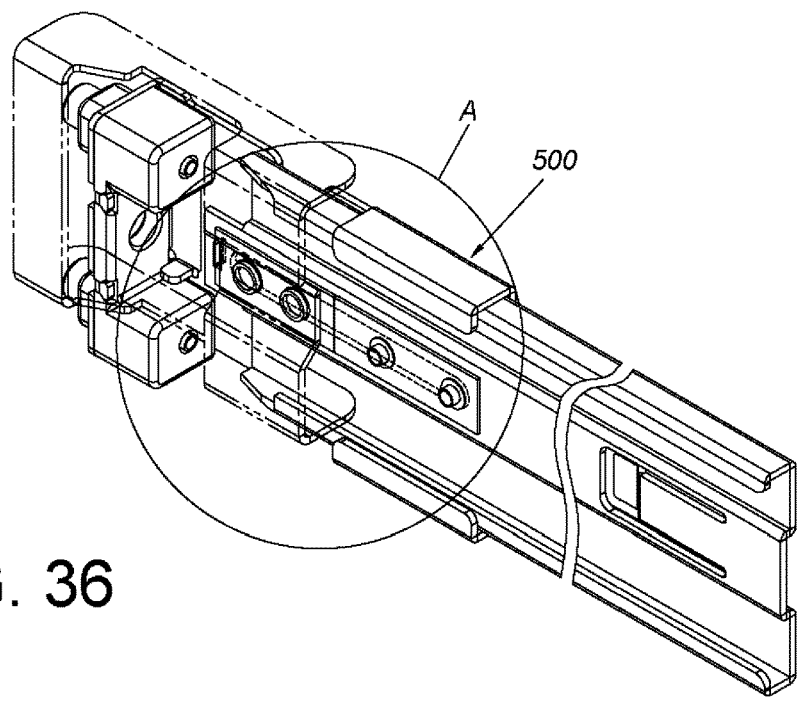
FIG. 36 is a diagram showing a fastening member of a bracket device in a locking state according to a fifth embodiment of the present invention.
Figure 37:
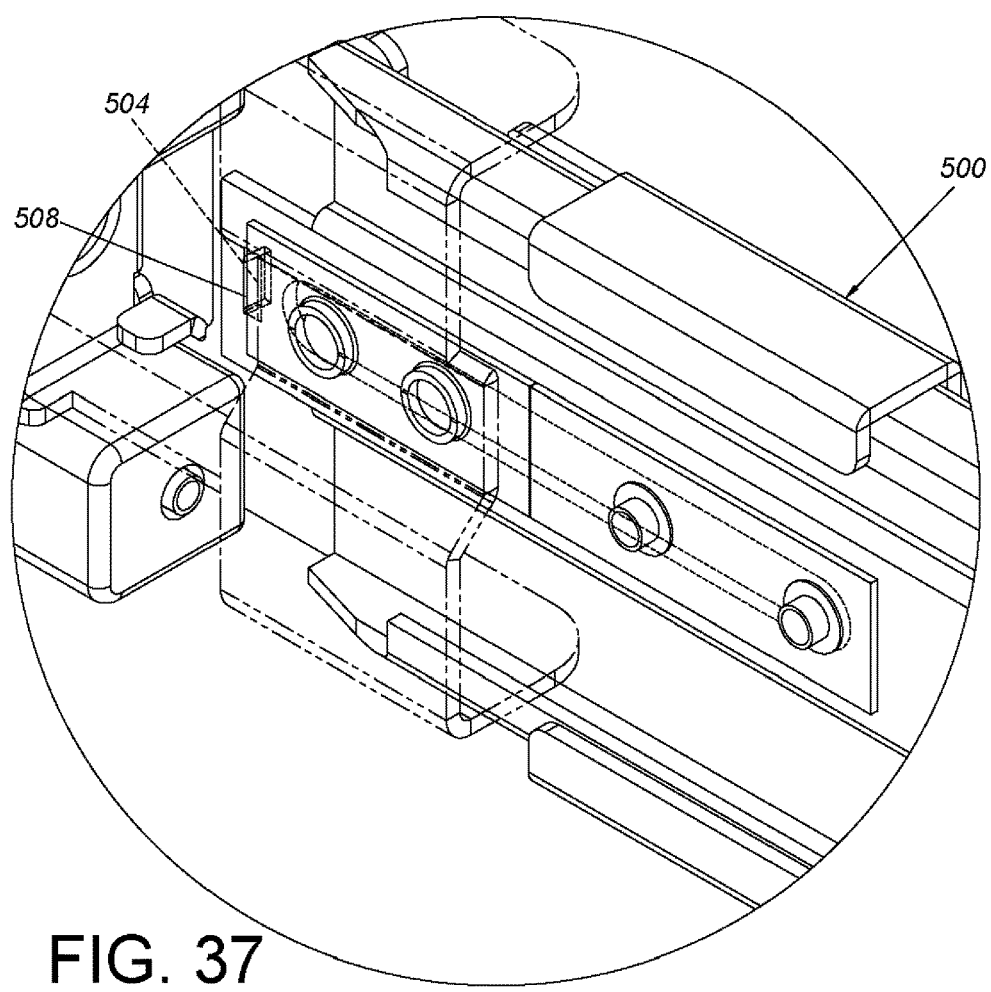
FIG. 37 is an enlarged view of an area A of FIG. 36.
Figure 38:
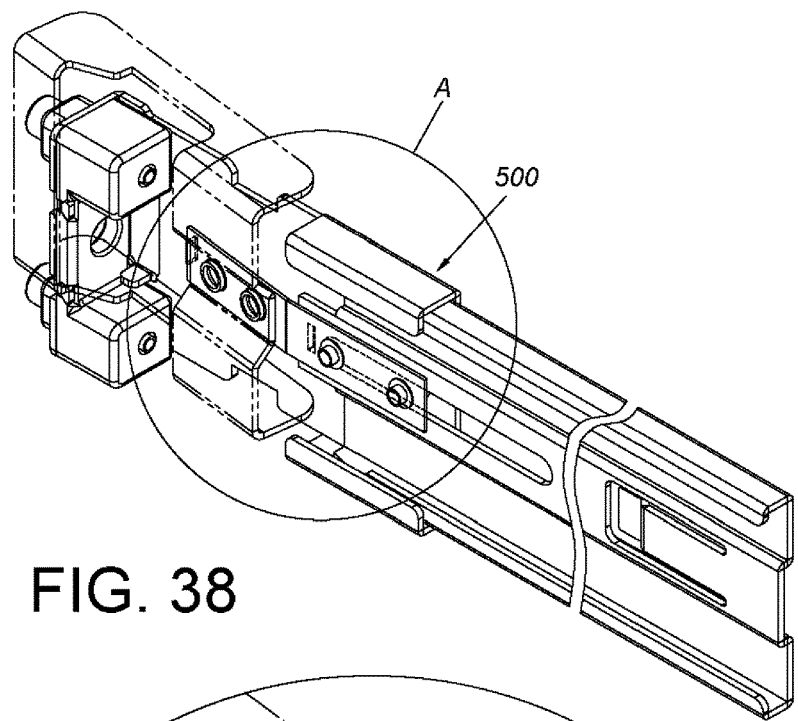
FIG. 38 is a diagram showing the fastening member of the bracket device in an unlocking state according to the fifth embodiment of the present invention.
Figure 39:
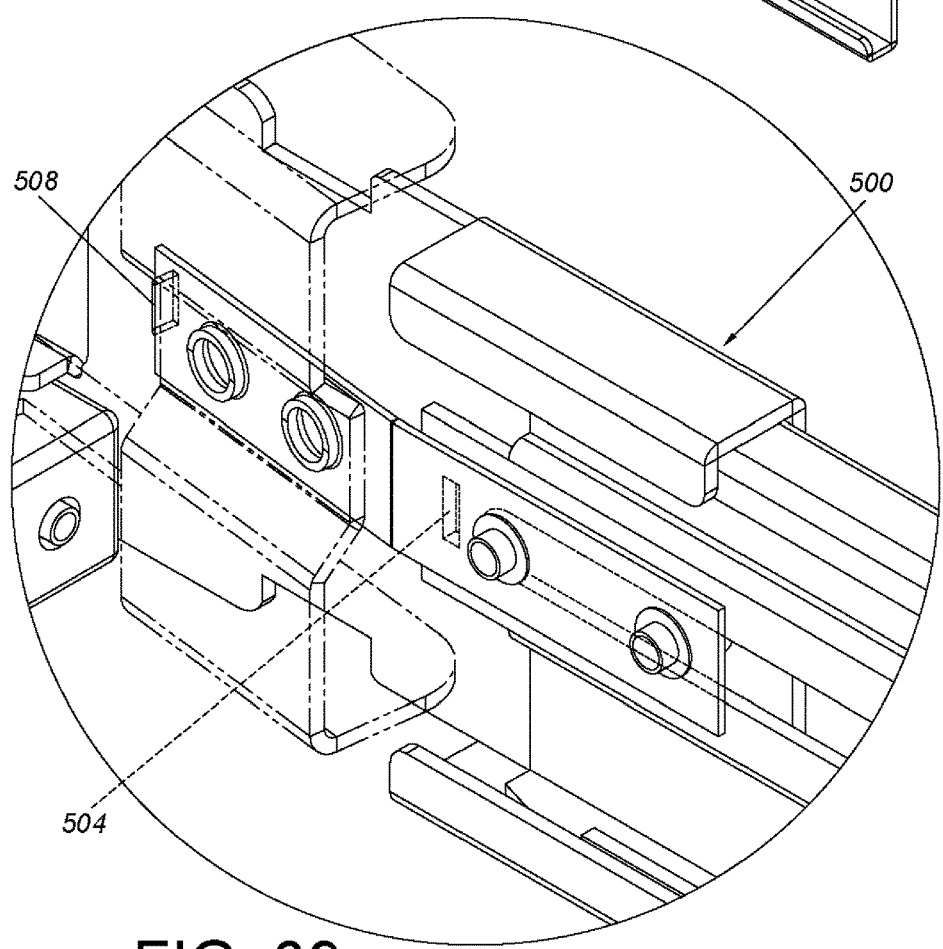
FIG. 39 is an enlarged view of an area A of FIG. 38.

As shown in FIG. 30 and FIG. 31, when an external force is applied to the supporting frame 302 of the bracket device 300 along the second direction D2, the supporting frame 302 is moved relative to the elastic member 306, such that the first stopping feature 304 and the second stopping feature 308 are disengaged from each other. Through an elastic force of the elastic member 306, the fastening member 310 is driven to switch from the locking state to the unlocking state, and held in the unlocking state.

The first stopping feature 304 and the second feature 308 shown in FIG. 29 can respectively be protrusions, which are protruded upward, abutting against each other. In other words, each of the first stopping feature 304 and the second stopping feature 308 is implemented in a form of a protrusion.

Or in a fourth embodiment of the present invention shown in FIG. 32 to FIG. 35, a first stopping feature 404 and a second stopping feature 408 of a bracket device 400 can respectively be protrusions, which are protruded laterally, abutting against each other. In other words, each of the first stopping feature 404 and the second stopping feature 408 is implemented in a form of a protrusion.

Or in a fifth embodiment of the present invention shown in FIG. 36 to FIG. 39, a first stopping feature 504 and a second feature 508 of a bracket device 500 can respectively be a hole and a protrusion abutting against each other. In other words, the first stopping feature 504 is implemented in a form of a hole, and the second stopping feature 508 is implemented in a form of a protrusion.

Through the aforementioned arrangement, the slide rail assembly can be conveniently and quickly mounted to or detached from the rack only by one user in front of the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a rail member having a first end part and a second end part opposite to the first end part;
a supporting rail fixedly connected to the rail member;
a first bracket connected to the rail member and adjacent to the first end part of the rail member; and
a bracket device located adjacent to the second end part of the rail member, the bracket device comprising:
a supporting frame movably mounted to the supporting rail;
a second bracket movably connected to the supporting frame;
a fastening member arranged at one side of the second bracket; and
an elastic member comprising a first elastic part and a connecting part, the first elastic part connecting the connecting part with the fastening member and being bent relative to the connecting part to accumulate an elastic force, the connecting part being slidably mounted to the supporting frame in a longitudinal direction of the supporting frame;
wherein when the connecting part of the elastic member is slid away from the support frame in the longitudinal direction, the fastening member is deflected in response to the elastic force of the first elastic part of the elastic member.

2. The slide rail assembly of claim 1, wherein the supporting rail is arranged with a first blocking part, the supporting frame is arranged with a second blocking part configured to abut against the first blocking part to allow the supporting rail to drive the supporting frame to move.

3. The slide rail assembly of claim 1, wherein the supporting frame comprises a first engaging feature, the elastic member further comprises a second elastic part connected to the connecting part, an end of the second elastic part is arranged with at least one second engaging feature, the second engaging feature is configured to be engaged with the first engaging feature of the supporting frame.

4. The slide rail assembly of claim 3, further comprising an auxiliary elastic member connected between the supporting frame and the elastic member.

5. The slide rail assembly of claim 3, wherein the supporting frame is arranged with an unlocking part adjacent to the first engaging feature, the unlocking part has an inclined surface or an arc surface.

6. The slide rail assembly of claim 3, further comprising an operating member movably mounted to the supporting frame, wherein the operating member comprises an unlocking part corresponding to the second engaging feature of the elastic member, when the operating member is operatively moved, the second engaging feature of the elastic member is disengaged from the first engaging feature of the supporting frame by the unlocking part of the operating member.

7. The bracket device for slide rail of claim 1, wherein the supporting frame comprises a limiting feature, the limiting feature is a bounded elongated hole having a first boundary end and a second boundary end, a connecting member is configured to connect the elastic member to the supporting frame to allow the elastic member to move within a limited range defined by the first and second boundary ends of the limiting feature and the connecting part.

8. The slide rail assembly of claim 1, further comprising an auxiliary elastic member mounted to the supporting frame, wherein the auxiliary elastic member comprises a supporting leg and an elastic leg, the elastic leg has a bending part, the second bracket is arranged with a stopping part, the fastening member comprises an auxiliary feature; when the fastening member of the bracket device is in a locking state, the bending part of the elastic leg of the auxiliary elastic member is configured to abut against the stopping part of the second bracket to hold the fastening member in the locking state, the fastening member is adjacent to or configured to abut against a top face of the supporting leg of the auxiliary elastic member in the locking state; when the supporting frame is applied by a force to move, the auxiliary elastic member is driven to move by the supporting frame, so as to allow the bending part of the elastic leg of the auxiliary elastic member to be disengaged from the stopping part, and allow the top face of the supporting leg of the auxiliary elastic member to face the auxiliary feature of the fastening member, such that the fastening member is driven to switch from the locking state to an unlocking state by the elastic force of the elastic member and held in the unlocking state.

9. The slide rail assembly of claim 1, wherein an end part of the supporting frame is arranged with a first stopping feature, an end part of the elastic member is arranged with a second stopping feature; when the fastening member is in a locking state, the first stopping feature is configured to abut against the second stopping feature to hold the fastening member in the locking state.

10. A slide rail assembly, configured to be mounted to a first post and a second post of a rack, the slide rail assembly comprising:
   a rail member having a first end part and a second end part opposite to the first end part;
   a first bracket connected to the rail member and adjacent to the first end part of the rail member, the first bracket being configured to be mounted to the first post; and
   a bracket device adjacent to the second end part of the rail member, the bracket device comprising:
      a supporting frame;
      a second bracket movably connected to the supporting frame;
      an elastic member mounted to the supporting frame and comprising a first elastic part and a connecting part; and
      a fastening member connected to the elastic member, the first elastic part connecting the connecting part with the fastening member and being bent relative to the connecting part to accumulate an elastic force, the connecting part being slidably mounted to the supporting frame in a longitudinal direction of the supporting frame;
   wherein when the second bracket is located at a second position relative to the supporting frame, the fastening member is in an unlocking state to allow the second bracket to be mounted to the second post; when the second bracket is moved from the second position to a first position relative to the supporting frame, the fastening member is deflected and the connecting part is slid relative to the supporting frame in the longitudinal direction of the supporting frame, which drives the fastening member to switch from the unlocking state to a locking state, in order to lock the second bracket to the second post.

11. The slide rail assembly of claim 10, further comprising an auxiliary elastic member connected between the supporting frame and the elastic member, wherein the supporting frame comprises a first engaging feature, the elastic member further comprises a second elastic part, and the connecting part is connected between the first elastic part and the second elastic part, an end of the second elastic part is arranged with at least one second engaging feature, the second engaging feature is configured to be engaged with the first engaging feature of the supporting frame.

12. The bracket device for slide rail of claim 11, further comprising an operating member movably mounted to the supporting frame, wherein the operating member comprises an unlocking part corresponding to the second engaging feature of the elastic member; when the operating member is operatively moved, the second engaging feature of the elastic member is disengaged from the first engaging feature of the supporting frame by the unlocking part of the operating member.

* * * * *